(12) United States Patent
Willemen

(10) Patent No.: US 6,168,065 B1
(45) Date of Patent: Jan. 2, 2001

(54) MOVABLE SELECTIVE DEBRIDGING APPARATUS FOR DEBRIDGING SOLDERED JOINTS ON PRINTED CIRCUIT BOARDS

(75) Inventor: Lambertus P. Willemen, Dorst (NL)

(73) Assignee: Soltec B.V., Oosterhout (NL)

( * ) Notice: Under 35 U.S.C. 154(b), the term of this patent shall be extended for 0 days.

(21) Appl. No.: 09/249,527

(22) Filed: Feb. 12, 1999

Related U.S. Application Data

(63) Continuation-in-part of application No. 09/024,086, filed on Feb. 17, 1998.

(30) Foreign Application Priority Data

| May 15, 1998 | (NL) | ................................................... 1009177 |
| Nov. 27, 1998 | (NL) | ................................................... 1010679 |

(51) Int. Cl.$^7$ ............................... B23Q 15/14; B23K 1/08

(52) U.S. Cl. ................................. 228/9; 228/20.1; 228/37

(58) Field of Search ............................. 228/9, 37, 180.1, 228/20.1, 264, 260

(56) References Cited

U.S. PATENT DOCUMENTS

| Re. 32,982 | 7/1989 | O'Rourke | .......................... 228/180.1 |
| 3,500,536 | 3/1970 | Goldschmeid | .......................... 29/623 |

(List continued on next page.)

FOREIGN PATENT DOCUMENTS

| 28 52 132 | 6/1979 | (DE) | ............................... H05K 3/34 |
| 0 050 701 | 3/1982 | (EP) | ............................... B23K 3/00 |
| 2410938 | 6/1979 | (FR) | ............................... H05K 13/04 |
| 738 874 | 10/1955 | (GB) | . |
| 967 708 | 8/1964 | (GB) | . |
| 1 181 421 | 2/1970 | (GB) | ............................... C23C 1/04 |

(List continued on next page.)

OTHER PUBLICATIONS

Brochures for Electrovert coN$_2$tour Plus Inert Boundary Soldering System (10 pp.).
User Manual for the Soltec Deltawave System, Selected Portions of Chapter 3, pp. 22–24, 26–28, 38–41, 63–65, 84.
Donovan, IBM Technical Disclosure Bulletin, vol. 5, No. 4, Sep. 1962, pp. 19–20.
Brochure for GBS Mark III Wavesoldering & Debridging System (4 pp.).

(List continued on next page.)

*Primary Examiner*—Patrick Ryan
*Assistant Examiner*—Kiley Stoner

(57) ABSTRACT

A debridging tool incorporated into an automated wave soldering system adjacent to and after a wave soldering station removes bridges and/or excess solder formed during the wave soldering process by emitting, at a desired temperature which can be set using a heater and one or more thermo measuring devices, a pressurized stream of air, inert gas or other fluid only under selected areas of a printed circuit board, including a flexible circuit. The tool comprises a movable nozzle from which the stream is emitted and a means for transporting the nozzle under the printed circuit board. The tool targets only those areas of the board where bridges or excess solder repeatedly form during the soldering process without disturbing solder joints where no bridges or excess solder form. Since the debridging tool is positioned close to the wave soldering station, the latent heat from the soldering process remains in the printed circuit board, and the gas mass is relatively small, the pressurized stream may be kept below the temperature of molten solder. An inert environment around the selective debridging tool and the wave soldering station may be used to reduce the oxidation of the solder and reduce the formation of dross in the solder pot. The main soldering tower of the wave soldering station may have a removable insert with a non-round roller for generating a turbulent wave in the main soldering tower when the insert is installed.

24 Claims, 34 Drawing Sheets

U.S. PATENT DOCUMENTS

| | | | |
|---|---|---|---|
| 3,515,330 | 6/1970 | Bronson et al. | 228/8 |
| 3,603,329 | 9/1971 | White et al. | 134/107 |
| 3,605,244 | 9/1971 | Osborne et al. | 29/471.1 |
| 3,705,457 | 12/1972 | Tardoskegyi | 29/494 |
| 3,724,418 | 4/1973 | McLain | 118/69 |
| 3,726,007 | 4/1973 | Keller | 29/626 |
| 3,765,591 | 10/1973 | Cook | 228/36 |
| 3,773,261 | 11/1973 | Helton | 239/133 |
| 3,841,557 | 10/1974 | Atkinson | 239/11 |
| 3,865,298 | 2/1975 | Allen et al. | 228/20 |
| 3,948,212 | 4/1976 | Mayer | 118/50 |
| 4,083,323 | 4/1978 | Rote | 118/6 |
| 4,401,253 | 8/1983 | O'Rourke | 228/125 |
| 4,402,448 | 9/1983 | O'Rourke | 228/125 |
| 4,410,126 | 10/1983 | O'Rourke | 228/180 R |
| 4,412,641 | 11/1983 | Fuchs et al. | 228/37 |
| 4,600,137 * | 7/1986 | Comerford | 228/102 |
| 4,632,291 * | 12/1986 | Rahn et al. | 228/9 |
| 4,659,003 * | 4/1987 | Simonetti | 228/8 |
| 4,664,308 * | 5/1987 | Boyton | 228/180.1 |
| 4,679,720 * | 7/1987 | Sedrick, Jr. et al. | 228/20 |
| 4,775,776 * | 10/1988 | Rahn et al. | 219/388 |
| 4,848,640 | 7/1989 | Gieskes | 228/37 |
| 4,995,411 * | 2/1991 | Lowell et al. | 134/198 |
| 5,121,875 * | 6/1992 | Hagerty et al. | 228/219 |
| 5,176,307 * | 1/1993 | Hagerty et al. | 228/37 |
| 5,203,489 | 4/1993 | Gileta et al. | 228/219 |
| 5,228,614 | 7/1993 | Elliot et al. | 228/37 |
| 5,232,562 * | 8/1993 | Elliot | 204/140 |
| 5,294,036 | 3/1994 | Den Dopper | 228/37 |
| 5,419,482 | 5/1995 | Hendrikx | 228/37 |

FOREIGN PATENT DOCUMENTS

| | | | |
|---|---|---|---|
| 1 446 636 | 8/1976 | (GB) | B23K 1/20 |
| 1 478 768 | 7/1977 | (GB) | B23K 1/08 |
| 1 483 257 | 8/1977 | (GB) | B23K 3/04 |
| 2 009 012 | 6/1979 | (GB) | B23K 1/00 |
| 1 602 779 | 11/1981 | (GB) | B23K 1/00 |
| 51-22650 | 2/1976 | (JP) | H05K 3/34 |
| 52-31945 | 3/1977 | (JP) | B23K 1/08 |
| 55-16726 | 2/1980 | (JP) | B23K 1/00 |
| 184862 | 6/1979 | (NL) | H05K 3/34 |
| 7811803 | 6/1979 | (NL) | H05K 3/34 |
| WO 94/17949 | 8/1994 | (WO) | B23K 1/08 |
| WO 94/20253 | 9/1994 | (WO) | B23K 1/08 |
| WO 99/41036 | 8/1999 | (WO) | B23K 3/06 |

OTHER PUBLICATIONS

Technology Brief, for Hot Airknife Effects on Wave—Soldered Printed Circuit Assemblies (26 pp.) Aug. 1990—United States Navy: Electronics Manufacturing Productivity Facility.

Recent Developments in Automatic Component Lead Trimming Methods and materials and "GBS"—A New Concept in Wave Soldering–K.G. Boynton, Hollis Engineering Inc., Nashua, New Hampshire, Paper from Proceedings of the First Printed Circuit World Convention, London, England, (Jun. 5–8, 1978) pp. 2.3.1–2.3.13.

* cited by examiner

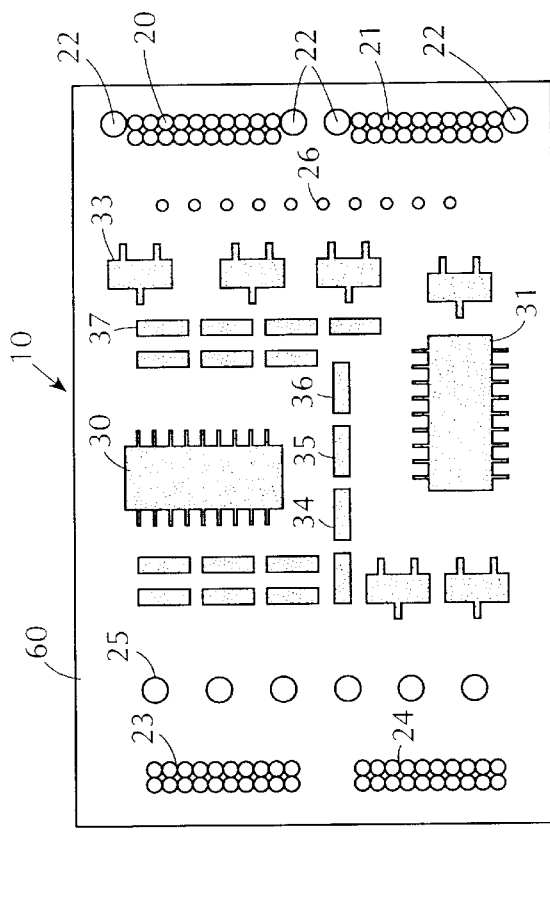
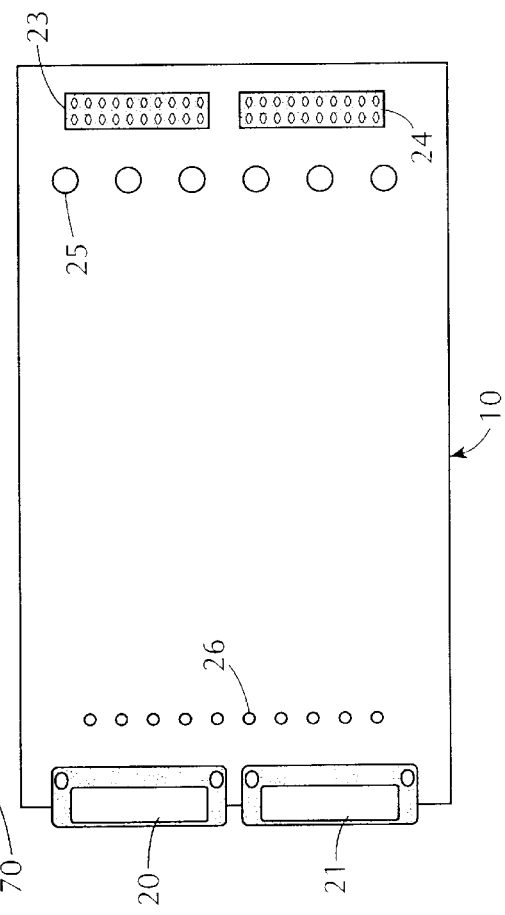

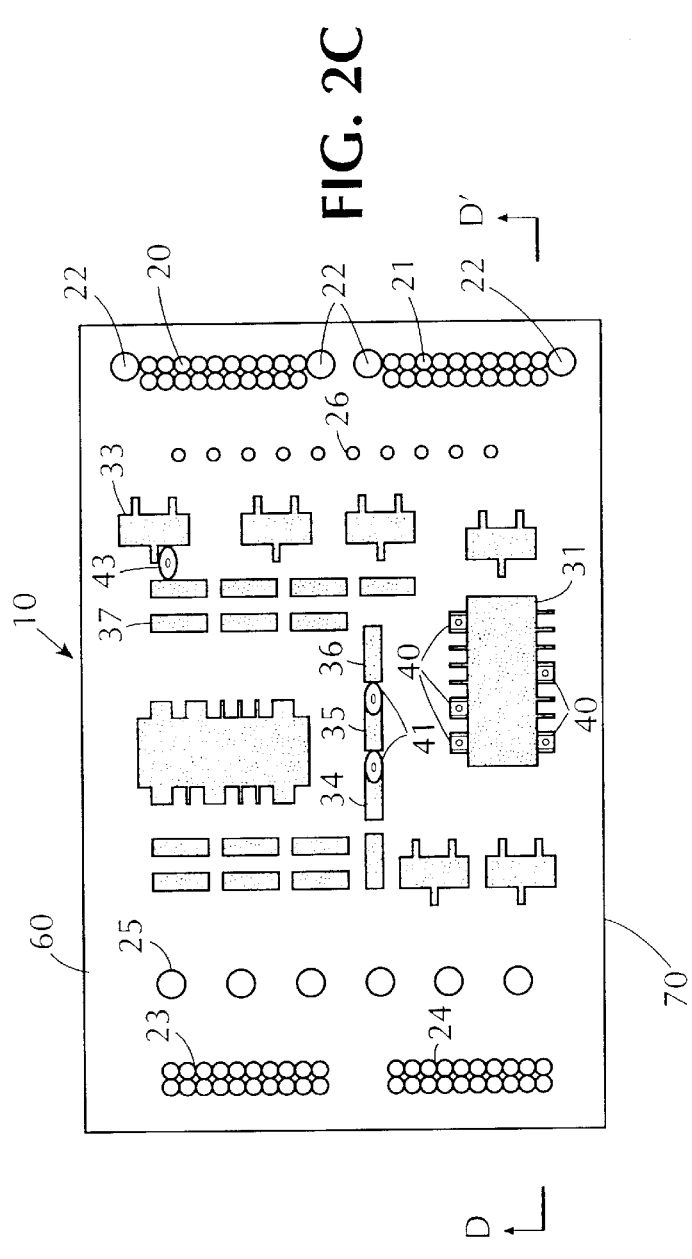
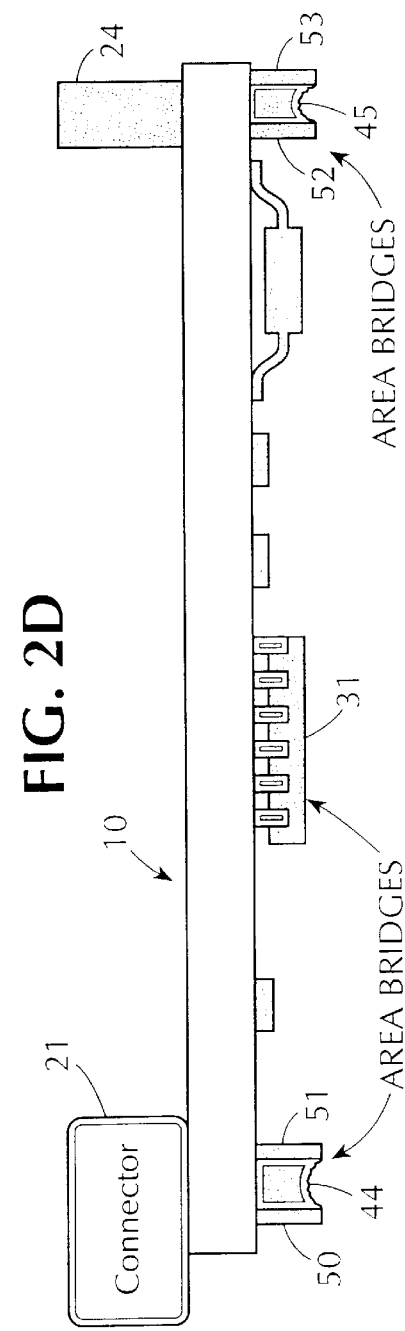

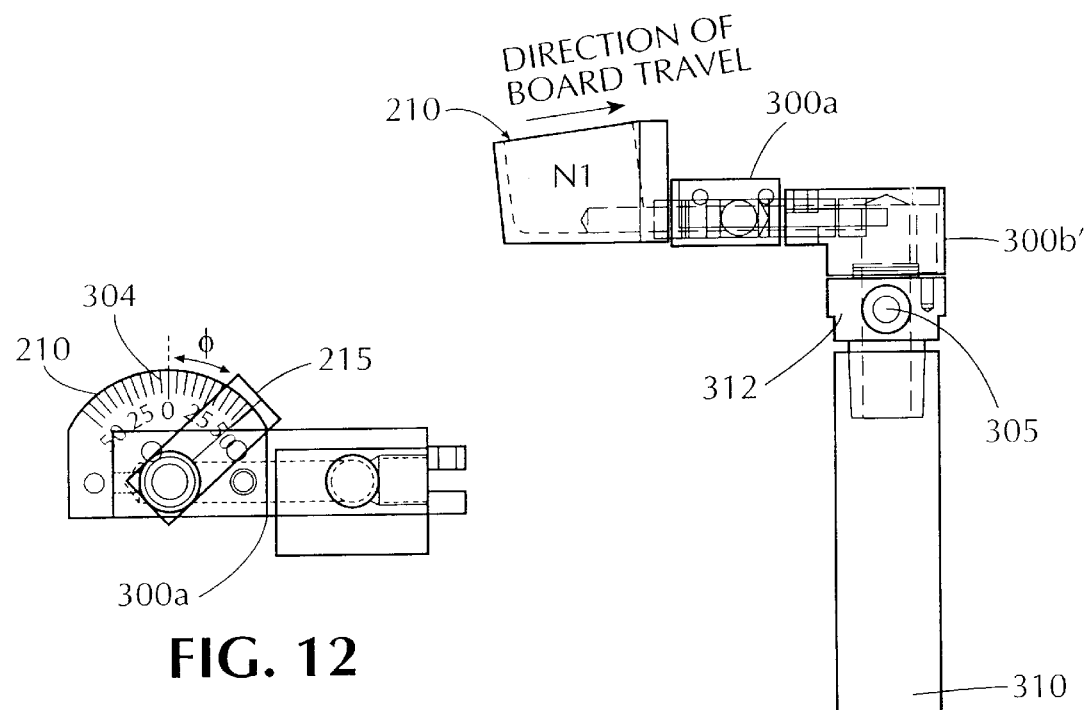
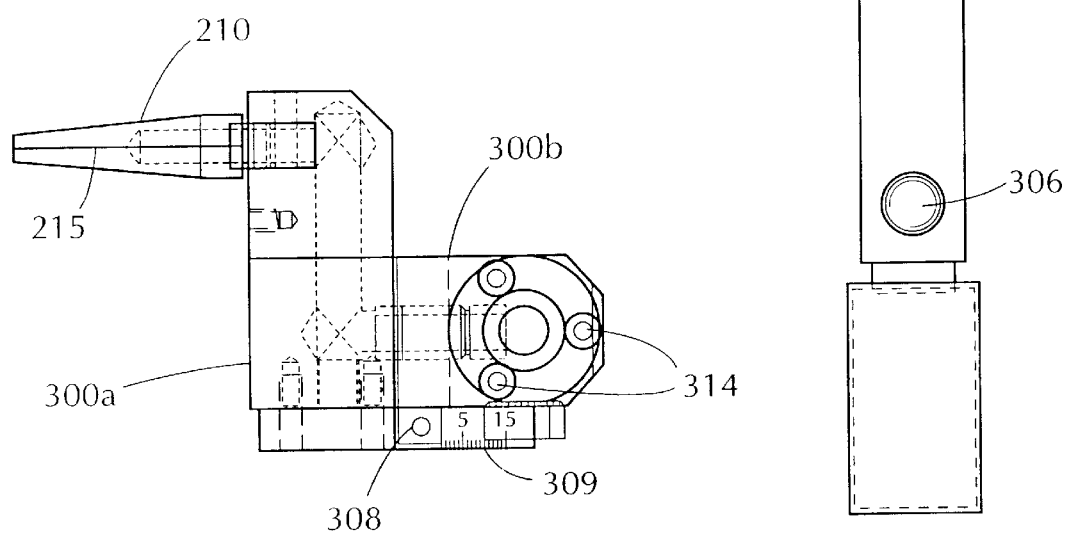
FIG. 12
FIG. 10
FIG. 11

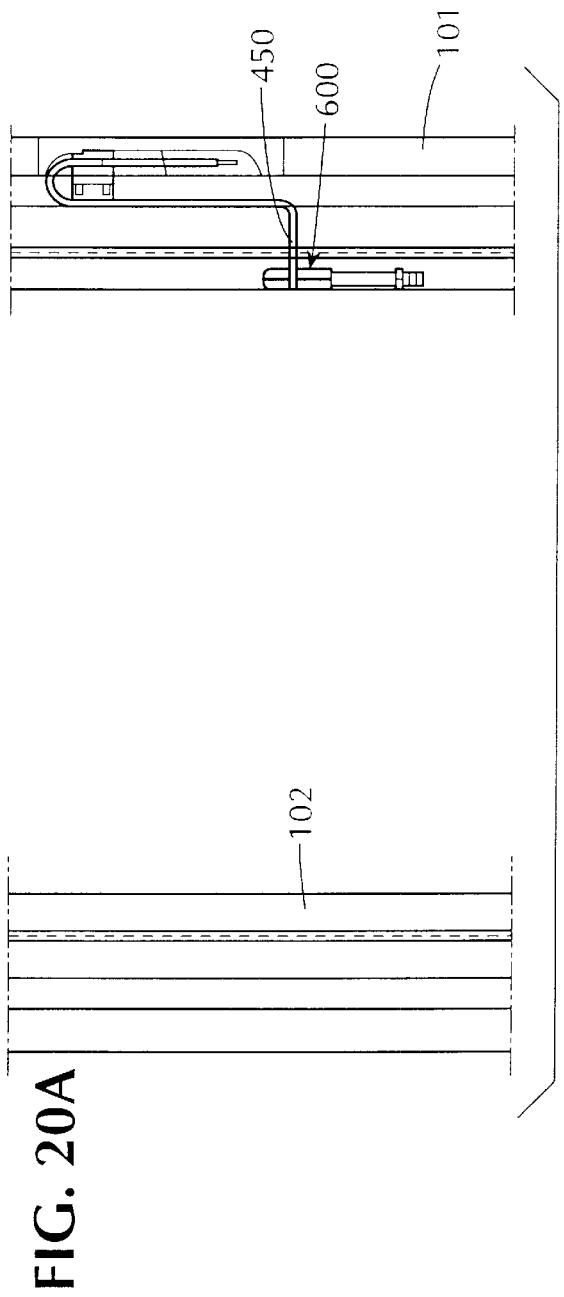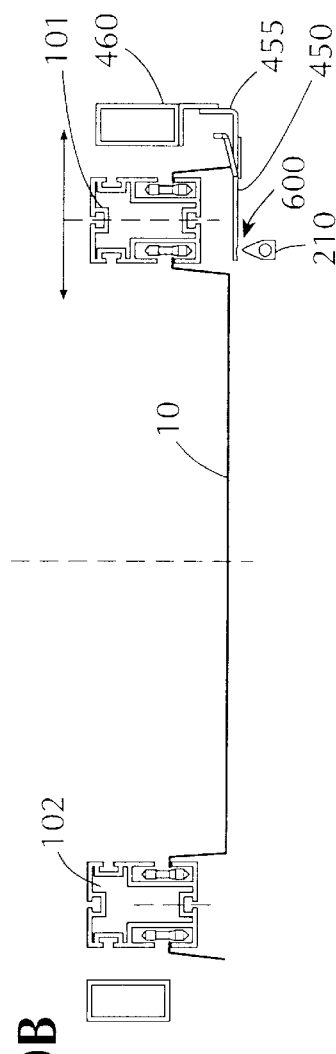
FIG. 20A
FIG. 20B

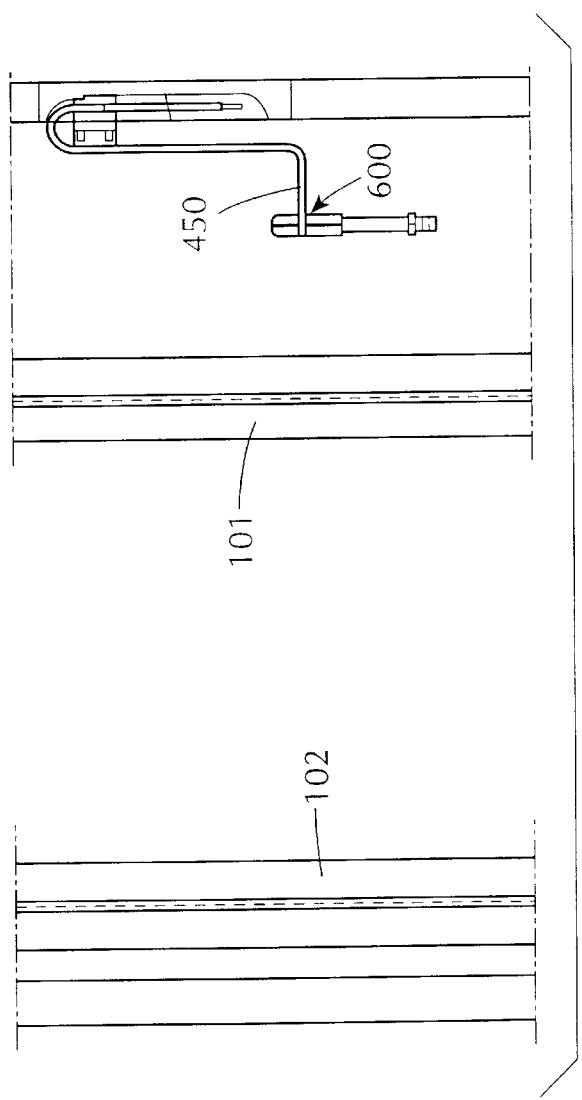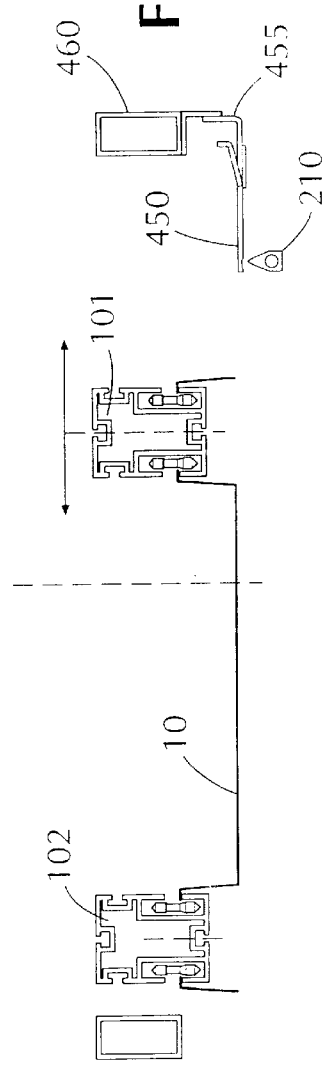

US 6,168,065 B1

MOVABLE SELECTIVE DEBRIDGING APPARATUS FOR DEBRIDGING SOLDERED JOINTS ON PRINTED CIRCUIT BOARDS

RELATED APPLICATION

This application is a continuation-in-part of co-pending application Ser. No. 09/024,086, filed Feb. 17, 1998, entitled Movable Selective Debridging Apparatus and Method of Debridging Soldered Joints on Printed Circuit Boards Using Same.

FIELD OF THE INVENTION

This invention relates to a method and apparatus for removing bridges and excess solder formed between or on soldered joints during an automated soldering process of electronic components so as to remove the bridges and excess solder without harming solder joints on the circuit board. The method and apparatus involve applying heated compressed air or an inert gas to selected portions of the printed circuit boards and flexible circuits after soldering.

BACKGROUND OF THE INVENTION

An electronic component is generally soldered onto printed circuit boards in one of two ways. Using a first approach, the component is mounted to a surface on one or both sides of the printed circuit board (known as "surface mount" technology). Alternatively, the component is mounted to the printed circuit board by mounting the body of the component on one side of the printed circuit board, inserting leads through holes in the board plated with a conductor (such as copper), and applying solder to the leads on the opposite side of the board (known as "through hole" technology). Through hole technology is well illustrated in FIG. 1 which shows a cutaway view of a single lead 1 inserted through a through hole 2 covered with copper laminated pad 3 in printed circuit board 10 (made of fiberglass/phenolic) and solder 4 holding lead 1. This patent application relates to both types of mounting in which the "bottom" side of the board will be "wave soldered".

Automated wave soldering systems for wave soldering of through hole components and surface mount components include a series of apparatus or stations within the system, each of which performs one step in the soldering process. The soldering process begins with the application of flux and/or other fluid used in preparation for soldering onto a printed circuit board, followed by the preheating of the board and the application of solder to the leads (in "through hole" technology) or component (in "surface mount" technology) protruding from the bottom of the board. The board is transported in the wave soldering system along a conveyor.

A significant problem with this prior art automated process has been that in some instances a bridge of solder has formed between adjacent conductors causing a short circuit. In through hole technology (FIG. 1), upon application of the solder to the bottom surface of the printed circuit board, strong adhesive forces bond the negatively-charged solder 4 which adheres by capillary forces between the wettable lead and positively-charged copper laminated pad 3 around through holes 2 and to the positively-charged copper leads 1 on the components passing through holes 2. In surface mount technology, the same type of forces bond the solder to surface mount component terminations. The solder molecules bond to each other with less strong cohesive forces. Therefore, excess solder between joints typically falls away and does not create a bridge. However, where joints are very close together, where leads are improperly clinched, or where the components mounted to the board have long leads which extend from the surface of the printed circuit board more than approximately 0.030 inches, or 0.8 mm, the strength of the adhesive forces may cause a bridge to form. Several processing-related factors related to wave dynamics, conveyor speed, conveyor angle, and/or using insufficient or no flux prior to soldering or using nitrogen during soldering either of which may increase surface tension, may also result in the formation of bridges.

FIG. 2A illustrates the bottom of a sample printed circuit board 10 before wave soldering. On this "mixed technology" board, to which this invention is by no means limited, some components are surface mounted and some components are mounted with through hole technology to form a printed wire assembly. Those components which are mounted with through holes to board 10 include D-Sub connectors 20, 21 which are mounted through through holes in board 10 and pin headers 23, 24. Components which are surface mounted to the bottom of illustrated board 10 include SOIC's (small outline integrated circuits) 30, 31, SOT's (small outline transistors) 33 and chip resistors 34–37. Also illustrated are large and small vias 25, 26, respectively, through which current is supplied to components on top of board 10 and mounting holes 22. The top of board 10 is illustrated in FIG. 2B.

FIG. 2C illustrates board 10 of FIG. 2A after wave soldering (and without any debridging). As shown, bridges 40, 41, 43 in board 10 have formed between terminations on SOIC 31, between chip resistors 34–36, and between chip resistor 37 and SOT 33, respectively.

FIG. 2D shows a cross-sectional view of board 10 of FIG. 2C along line D–D'. In addition to bridges 40, 41, 43, bridges 44, 45 have formed between leads 50, 51 on connector 21 and between leads 52, 53 on pin header 24 during wave soldering.

The cohesive forces in the solder strengthen as the solder solidifies. Thus, a bridge can be removed without damaging the joint only if the solder has not solidified. The time of solidification is dependent on several variables including the solder alloy used, the solder temperature, board mass, solder mass and environment temperature. One time consuming method of removing a bridge is to inspect each board for bridges after it exits from the mass soldering system, manually removing the bridge of existing solder with a soldering iron and/or soldering wick and manually resoldering the joint.

Electrovert's Hot Air Knife

An alternative to manual debridging, currently in use in some commercial wave soldering systems, is to incorporate a hot air knife following the soldering station. This type of hot air knife is described in U.S. Pat. Nos. 4,401,253, 4,402,448, and Re. 32,982. The hot air knife shown in these patents (which is also implemented to some degree commercially by Electrovert Ltd., Grand Prairie, Tex.) comprises a manifold extending the entire width of the conveyor. The Electrovert hot air knife blows the entire width of the conveyor regardless of the width to which the conveyor is adjusted. Compressed air or inert gas is output from the orifice of the hot air knife at a high flow rate and is aimed at the bottom of the board following the application of the solder while the solder is still molten. While the adhesive and capillary forces retain the solder on the joints, the hot air knife breaks the cohesive forces and "relocates excess solder on, and/or blasts excess solder from the underside of the board, interconnections, leads, and bodies, and in doing so also minimizes the possibility of solder bridging or icicling or short formation upon solidification." Re. 32,982, col. 5, lines 48–52.

Electrovert's AccuKnife has both a vertical adjustment in the height of the nozzle and an adjustment of the nozzle towards or away from the wave, both requiring movement of the entire manifold.

Electrovert currently manufactures commercial products known as AccuKnife, a hot air debridging tool, and CoN$_2$tour$^{PLUS}$, a similar device which performs the debridging function using inert hot gas. Re. 32,982 describes the stream as heated to a temperature in the range of 93° C.–350° C. It is applicants' understanding that in Electrovert's commercial products the stream of air or inert gas must be heated to a temperature above the temperature of molten solder (known as the eutectic point of solder, which for the current standard 63/37 tin/lead solder alloy is 183° C.).

Electrovert's present commercial hot air knives (including AccuKnife and CoN$_2$tour$^{PLUS}$), and the hot air knife shown in U.S. Pat. Nos. 4,401,253, 4,402,448, and Re. 32,982 present significant disadvantages because they extend over the entire width of the conveyor system carrying the printed circuit board and operate continuously at a high flow rate when the soldering system is on. These hot air knives, therefore, unnecessarily treat the entire bottom surface of the board although many, if not most, of the joints do not require debridging. As a result, defective joints are induced and some weaker joints, including larger joints, such as large vias 25 or mounting holes 22, where cohesive forces of solder joints are weak, are blown out, thereby adversely affecting the reliability of the board. The boards have to be inspected and manually repaired after application of the hot air knife when this occurs. The prior art also creates additional work to clean the soldering equipment of undesirably blown out weak joints.

Moreover, the application of a large quantity of heated air required by the prior art further dictates that the manifold in which the air is heated be relatively large and therefore heavy, and consume large amounts of energy to compress and heat the air. Increased air conditioning is also needed to cool the room in which the soldering system is operated due to the amount of heat exhausted by the prior art system.

These disadvantages are particularly pronounced in the Electrovert AccuKnife in which the hot air knife always remains on and compressed air or gas is continuously output from the orifice of the hot air knife while the soldering system is activated.

The CoN$_2$tour$^{PLUS}$ suffers somewhat less from these disadvantages as the inert gas only flows at a rate required for debridging when a printed circuit board travelling through the conveyor system is above the hot air knife. When the printed circuit board is not above the hot air knife, the CoN$_2$tour$^{PLUS}$ emits a constant bleed stream at a low flow rate.

Wave Soldering Using Vitronics Soltec's Nitro Wave™ and Nitro Hood™ Systems

Wave soldering in an inert environment minimizes the formation of defects, such as bridges, icicles, flags, and webbing, on the board and its components. One such system which provides an inert nitrogen environment is commercially manufactured by Vitronics Soltec B.V. as the Nitro Wave™ system. (An earlier developmental version of this system is described in U.S. Pat. No. 5,419,482.) In the Nitro Wave™ system, further described below, three diffusers diffuse nitrogen around two soldering towers and under a partial cover. As the board passes above the diffusers, the diffused nitrogen is trapped under the board as the board passes through the solder waves.

Another such system which provides a nitrogen environment is described in U.S. Pat. No. 5,294,036 and is commercially manufactured by Vitronics Soltec B.V. as the Nitro Hood™ system. In this system, which may be used independently or in combination with the Nitro Wave™, a hood is placed above the soldering towers and three nitrogen diffusers, other than the diffusers for the Nitro Wave™, are placed under the hood to blanket the printed circuit board with nitrogen.

U.S. Pat. Nos. 5,294,036 and 5,419,482 are incorporated by reference herein.

It is desirable to enable both the Nitro Wave™ and Nitro Hood™ systems to operate in combination with the selective debridging tool of the present invention to minimize the oxidation of the solder on the printed circuit boards and to reduce dross formation. However, the existing Nitro Wave™ occupies the location of the selective debridging tool and the Nitro Hood™ is currently not large enough to cover both the soldering towers and the selective debridging tool.

SUMMARY OF THE INVENTION

It is an object of the invention to provide a temperature sensor to measure the actual temperature of the air or inert gas stream at the nozzle of a selective debridging tool to closely regulate the stream temperature.

It is a further object of the invention to provide a soldering apparatus that has a wave soldering station, a movable selective debridging tool, and one or more means for maintaining an atmosphere excluding oxygen above the wave soldering station and selective debridging tool.

It is a further object of the invention to provide a soldering apparatus that has a selective debridging tool and a main soldering tower having a removable waveformer for creating turbulence in solder waves.

In accordance with the present invention, a wave soldering system for soldering electronic components to a printed circuit board has a selective debridging tool for removing solder from only specifically targeted areas of a printed circuit board where bridges or excess solder forms. Each target area comprises a first surface area which is only a portion of the entire surface area of the printed circuit board. The tool comprises a movable nozzle having an orifice for emitting an air or gas stream onto the printed circuit board at a temperature that may be varied and a means for transporting the nozzle between a park position and the first surface area of the printed circuit board for removing solder from the first surface area. The wave soldering system also has a first thermo measuring device positioned above the park position at a selected distance from the orifice for measuring the temperature of the stream at the park position. This selected distance is equal to the distance between the orifice and the printed circuit board as the board is transported above the debridging tool by a transport system, such as a conveyor. A second thermo measuring device is mounted to the tool to measure the temperature of the stream at a point before the stream is emitted from the orifice. A heater heats the stream before it is emitted from the nozzle.

The temperature of the air or inert gas stream is regulated with a control unit for controlling the heater to heat the stream to a preset temperature when the nozzle is in the first position. When the nozzle is not in the first position, the control unit maintains the preset temperature and monitors the stream temperature with the second thermo measuring device.

The soldering system has a soldering station for generating a soldering wave positioned adjacent and preceding said debridging tool. To enhance the operation of the debridging tool, the nozzle is adjustable toward or away from the soldering station. The nozzle is also adjustable vertically toward or away from the printed circuit board and may be rotated about a horizontal axis and a vertical axis. Moreover, the configuration and orientation of the nozzle may be varied.

Using the debridging tool, selected areas of a printed circuit board may be debridged following the application of a solder wave to the printed circuit board, by moving the nozzle over a first area of the printed circuit board where there is a bridge or excess solder of solder at a first speed and emitting the air or gas stream only while the nozzle passes under the area to be debridged or reshaped. After debridging a first area, one or more other areas may be similarly debridged or reshaped. While the air or gas stream may be emitted on the first area at a first pressure, the stream may be emitted on each of the other areas to be debridged at a different pressure.

The debridging tool may comprise a plurality of nozzles. The plurality of nozzles may be mounted to a single nozzle assembly or separate nozzle assemblies which move independently but operate in a coordinated manner to each debridge different areas of the printed circuit board.

Regardless of the precise configuration, the debridging tool of the present invention may be operated in an inert environment, such as a nitrogen environment, having an atmosphere with an oxygen content reduced to less than 20% in the vicinity of the debridging tool and the wave soldering station. Operating in an inert environment prevents the oxidation of soldering surfaces and reduces the formation of dross in the solder pot.

To obtain an inert environment, one or more means are provided for diffusing and retaining inert gas, generally nitrogen, around both the solder wave and debridging tool. One such means is a laterally extending diffuser at least partially located under the path of the debridging tool, an at least partial enclosure (or "cover") above the wave soldering station and a plate between the enclosure and the diffuser to direct the inert gas from the diffuser to under the enclosure. A second alternative means for obtaining an inert environment is a laterally extending diffuser located between the debridging tool and a soldering tower of the wave soldering station. A third means for obtaining an inert environment is a hood mounted above the debridging tool and wave soldering station and one or more diffusers for diffusing inert gas under the hood to blanket the debridging tool and wave soldering station with inert gas. This third means may be used in conjunction with the first or second means.

The wave soldering system may also have a soldering tower having a nozzle for forming a solder wave and a roller driven with a non-round transverse section. The roller is removably insertable within the nozzle of the soldering tower to generate turbulence in the solder wave.

BRIEF DESCRIPTION OF THE DRAWINGS

The inventions and modifications thereto will become better evident from the detailed description below in conjunction with the following figures:

FIG. 2A is a plan view of a printed circuit board before the board has been soldered;

FIG. 2B is a top view of the board of FIG. 2A;

FIG. 2C is a plan view of the board of FIG. 2A after the board has been soldered and bridges have formed;

FIG. 2D is a cross-sectional view of FIG. 2B along line D–D';

FIG. 10 is a top view of the nozzle assembly of the selective debridging tool assembly shown in FIG. 7 to which the first nozzle and nozzle mount have been mounted with the axis of the nozzle positioned parallel to the direction of travel of the board and the orifice of the nozzle pointing perpendicular to the board;

FIG. 11 is a side view of the nozzle assembly shown in FIG. 10, including the in-line heater;

FIG. 12 is a front view of the nozzle and nozzle mount shown in FIG. 10 with the nozzle orifice rotated sideways;

FIG. 20A is a top plan view of the conveyor, the front and back endless chain conveyors adjusted to their maximum width, and a temperature sensor mounted to the rear of the frame of the wave soldering system above the park position of the selective debridging tool;

FIG. 20B is a cross-sectional view of the conveyor and temperature sensor of FIG. 20A;

FIG. 21A is a top plan view of the conveyor, the back rail moved to smaller width than in FIG. 20A, and a temperature sensor mounted to the rear of the frame of the wave soldering system;

FIG. 21B is a cross-sectional view of the conveyor and temperature sensor of FIG. 21A;

DETAILED DESCRIPTION

Figure 1:
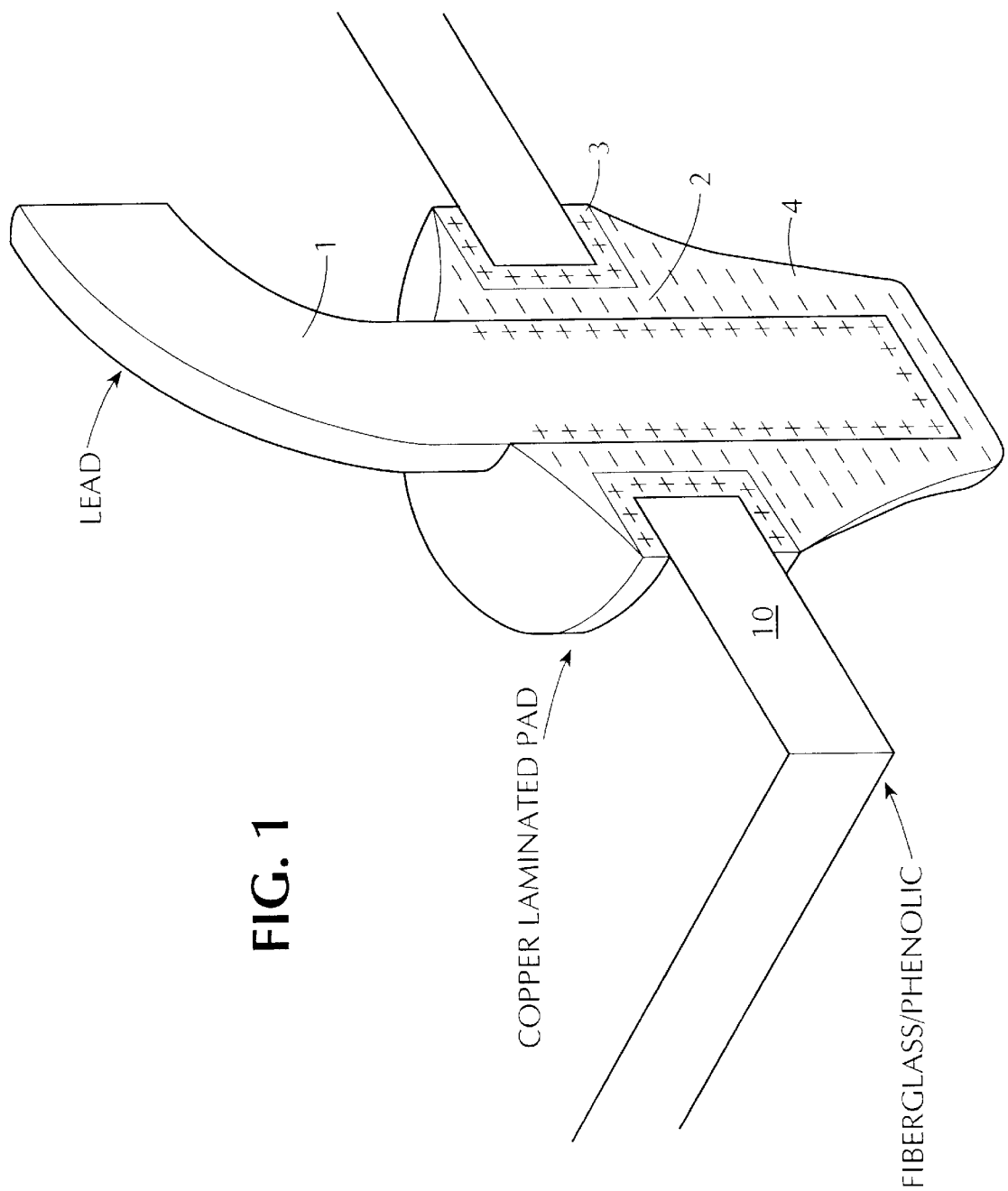
FIG. 1 is an enlarged cutaway view of a component lead passing through the board after the lead has been soldered.
Figure 3A:
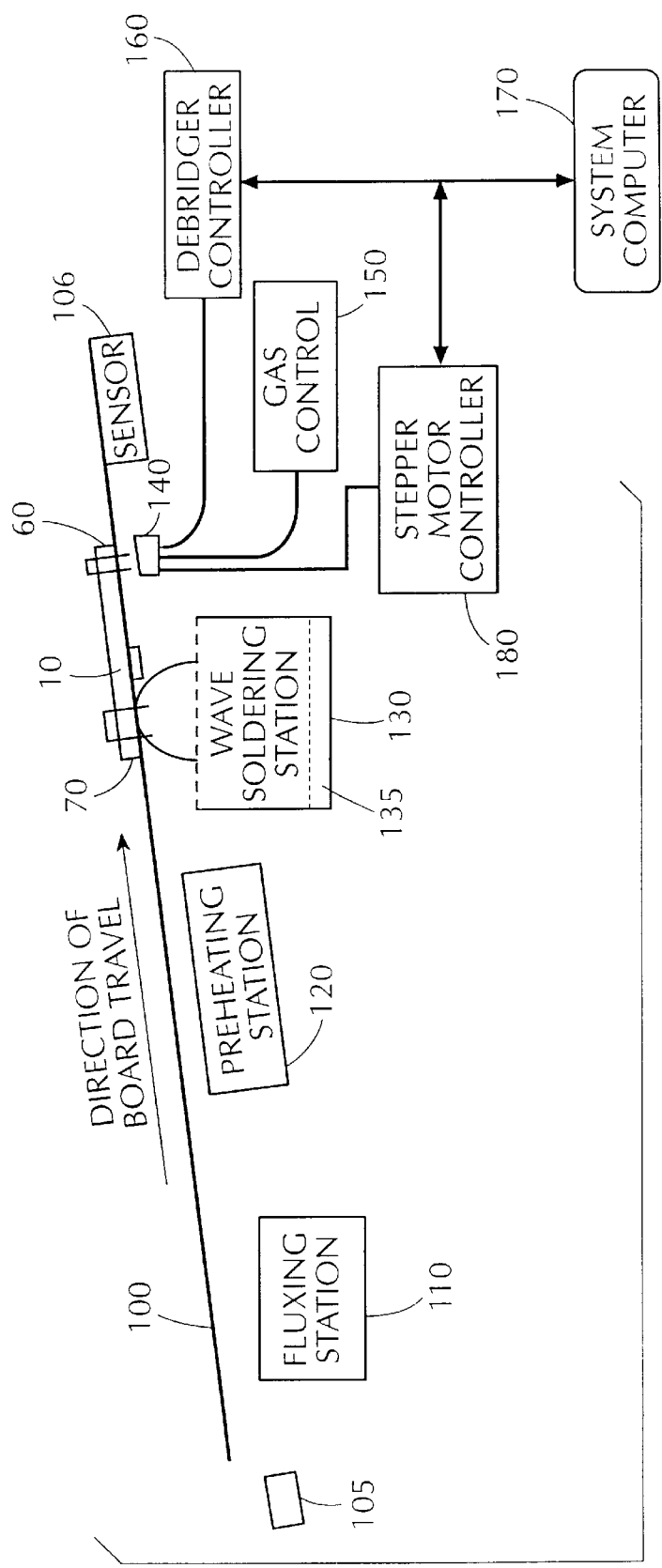
FIG. 3A is a schematic representation of a wave soldering system incorporating the selective debridging tool of the present invention.
Figure 4A:
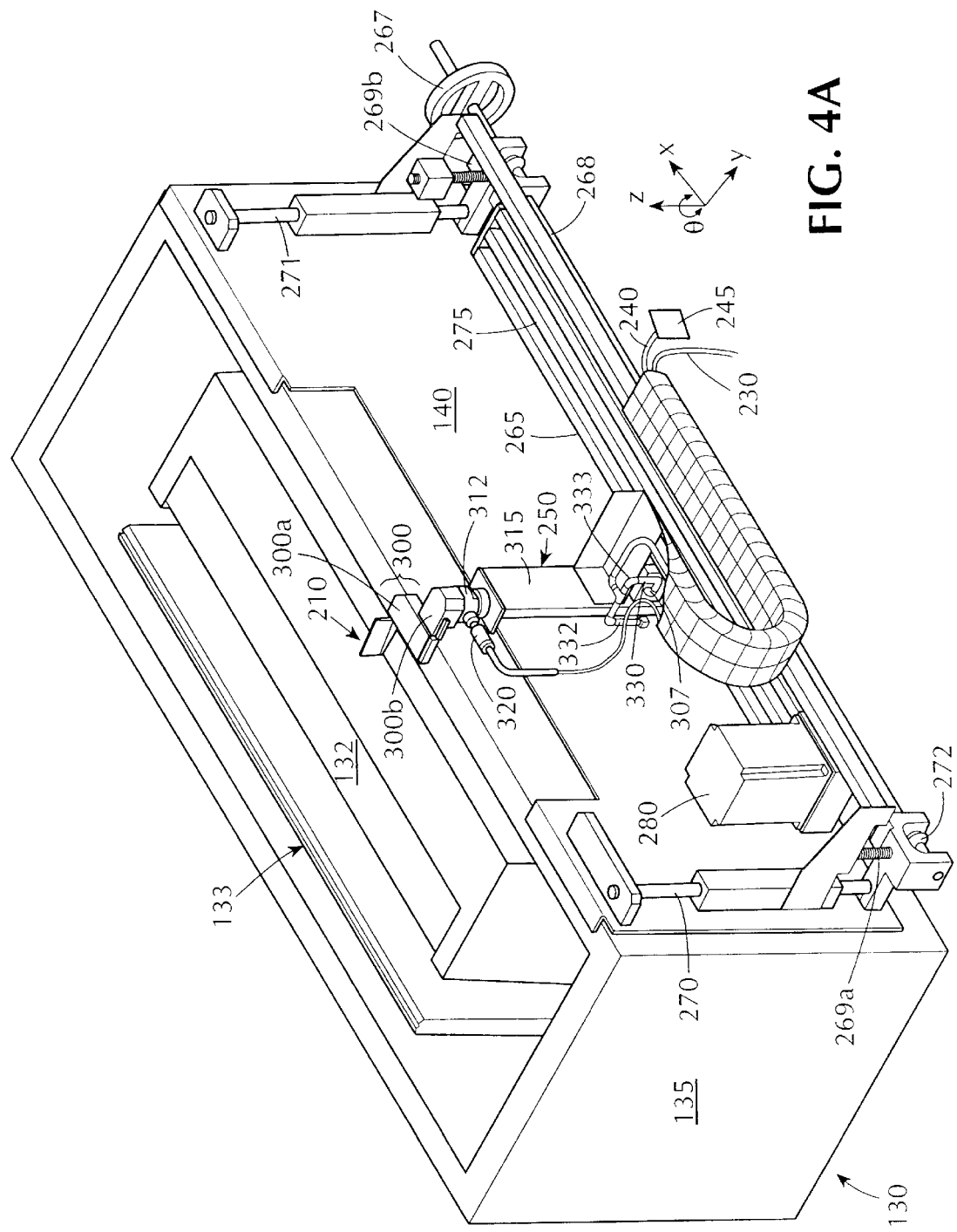
FIG. 4A is an isometric view of an embodiment of the soldering station of the wave soldering system and the selective debridging tool of the present invention with a single nozzle assembly including a nozzle, as shown in more detail in FIGS. 10–12, on the selective debridging tool such that the orifice of the nozzle is parallel to the direction of travel of the board.

Referring to FIG. 3A, the selective debridging tool of the present invention is used in conjunction with wave soldering systems and may be retrofitted for well known wave soldering systems, such as those presently sold under the designations Delta Wave and Delta Max by Vitronics Soltec B.V., the assignee of the present application, and its U.S. subsidiary, Vitronics Soltec, Inc. (collectively "Vitronics Soltec"). In this system, which except for the selective debridging tool is well known in the art, board 10 is inserted into a conveyor system 100. The board is moved by conveyor 100, passing first above fluxing station 110, where flux is applied to the bottom of the board. Board 10 then passes through a preheating station 120 where board 10 is heated to a temperature usually within the range of 90 to 130° C. topside temperature. Board 10 next passes above the wave soldering station 130 where wave soldering is performed. The wave soldering station 130 may comprise a single wave (not shown but having only a single solder tower from which solder flows) or a double wave system comprising a first, main soldering tower 136 for a main wave 132 and a second soldering tower 137 for a secondary (chip) wave 133 (which is turbulent) (FIG. 4A). Both single and double wave systems are well-known in the art. In either system, wave soldering station comprises a solder pot 135 which serves as a reservoir for the molten solder applied in the wave soldering station.

As used herein, including in the claims, the term "printed circuit board" is defined to include any circuit assembly support such as a printed circuit board made of fiberglass/phenolic or a flexible circuit. Moreover, although the present invention may be used for removing a bridge of solder between two joints, it should be understood that the invention may be similarly used to remove excess solder from solder joints.

Figure 3B:
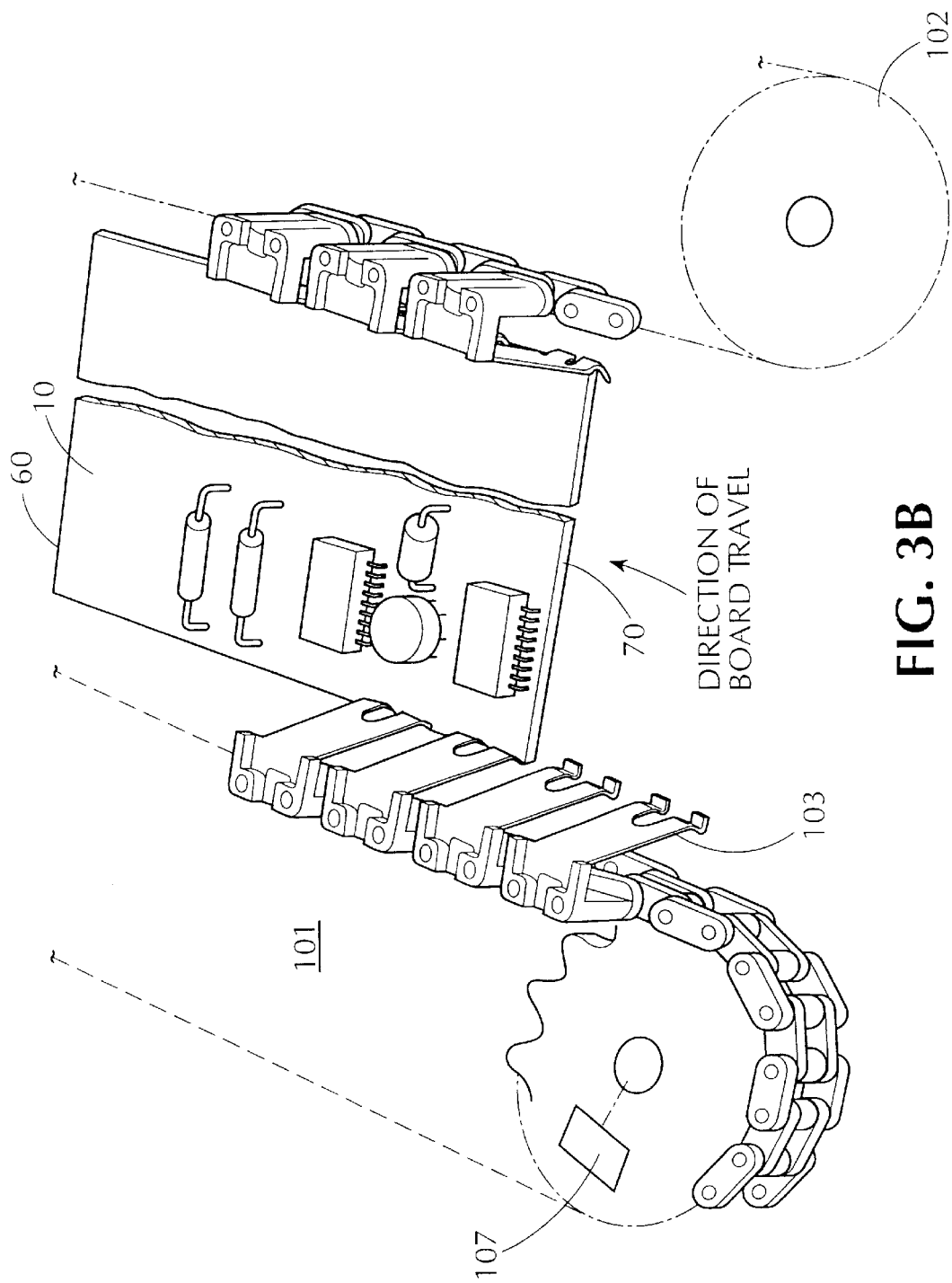
FIG. 3B is a partial perspective of a conveyor system for transporting printed circuit boards in a wave soldering system of the present invention.
Figure 6:
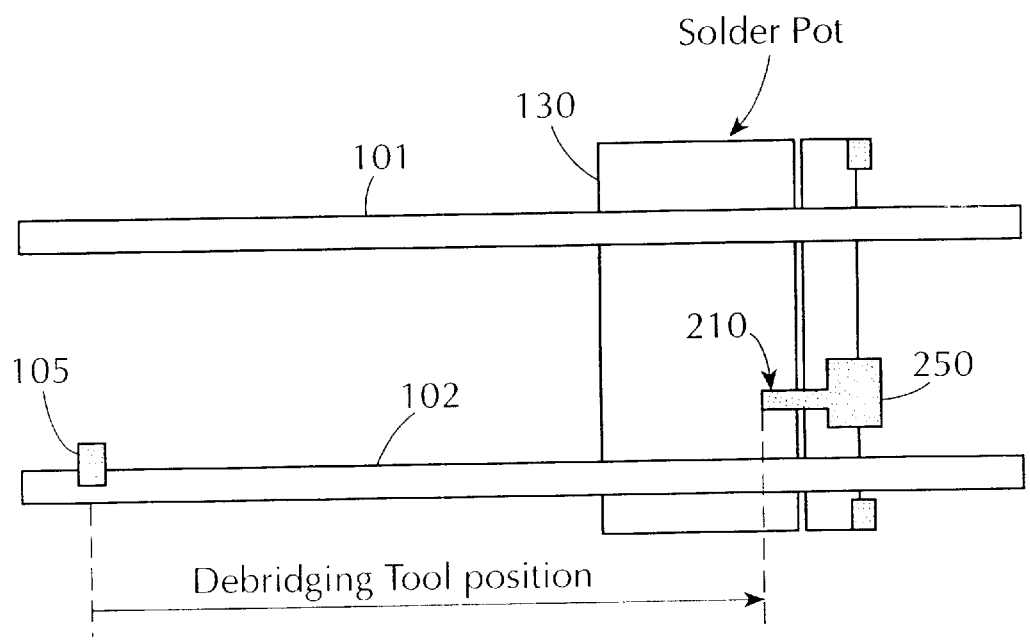
FIG. 6 is a schematic representation of an embodiment of the top of the wave soldering system showing the conveyor rails, solder station and selective debridging tool adjacent thereto.

In Vitronics Soltec's wave soldering systems, conveyor 100 comprises a pair of endless chain conveyors 101 and 102, as shown in FIGS. 3B and 6. Board 10 is held between leaf-like spring members 103 connected to conveyors 101, 102 as spring members 103 move along rails of conveyors 101, 102. One example of the spring members 103 is described in detail in U.S. Pat. No. 5,029,696, which is incorporated by reference herein and which is assigned to the assignee of the present application. To allow for the transport of printed circuit boards of differing widths, one endless chain conveyor 102 is fixed while the other endless chain conveyor 101 may be adjusted either away from or towards endless chain conveyor 102 to accommodate the dimensions of the respective printed circuit boards or pallets (in which flexible circuits and other boards may be inserted) in the system.

Figure 9:
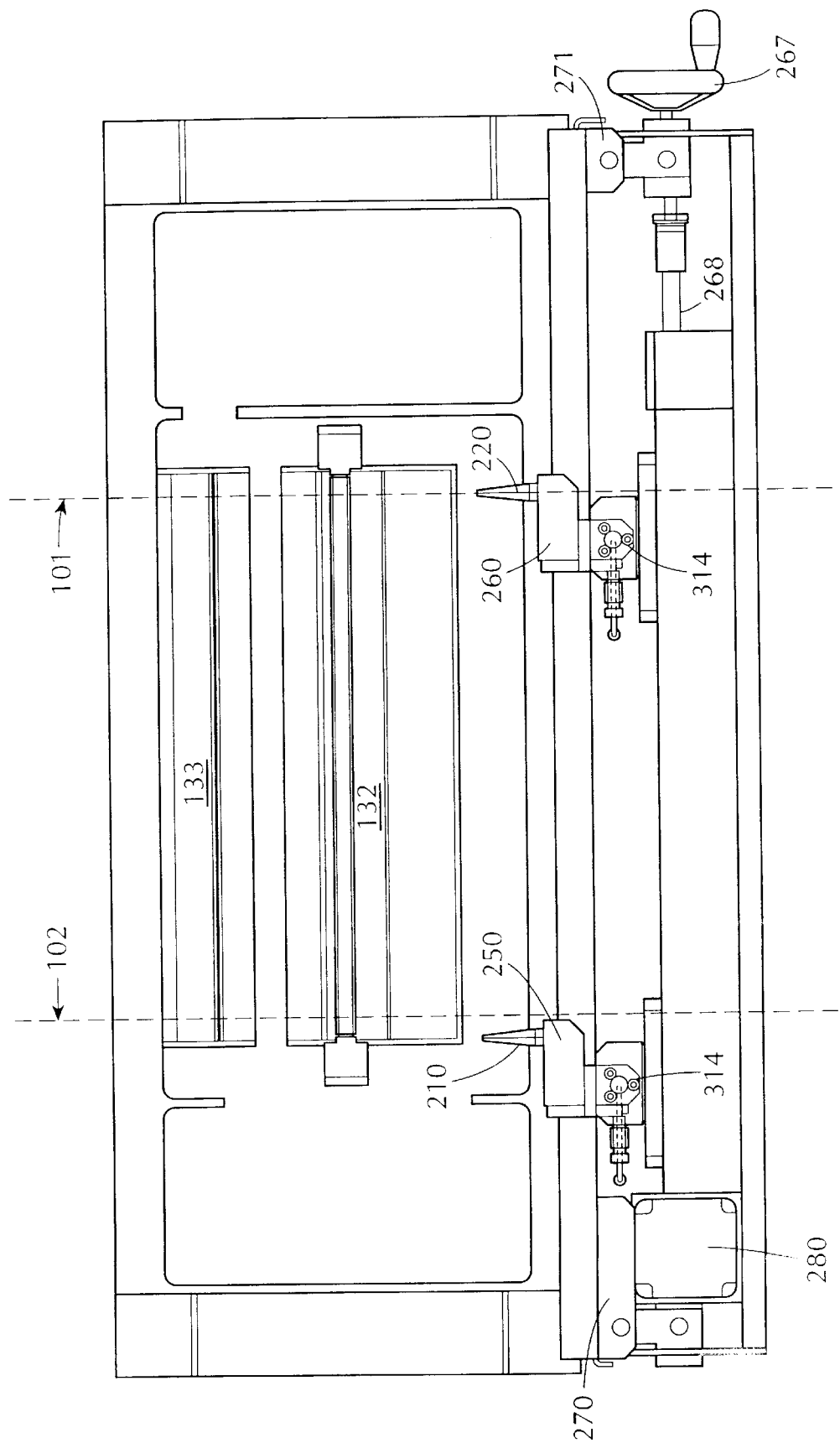
FIG. 9 is a top view of another embodiment of the wave soldering station and the selective debridging tool of the present invention with two nozzle assemblies.
Figure 17:
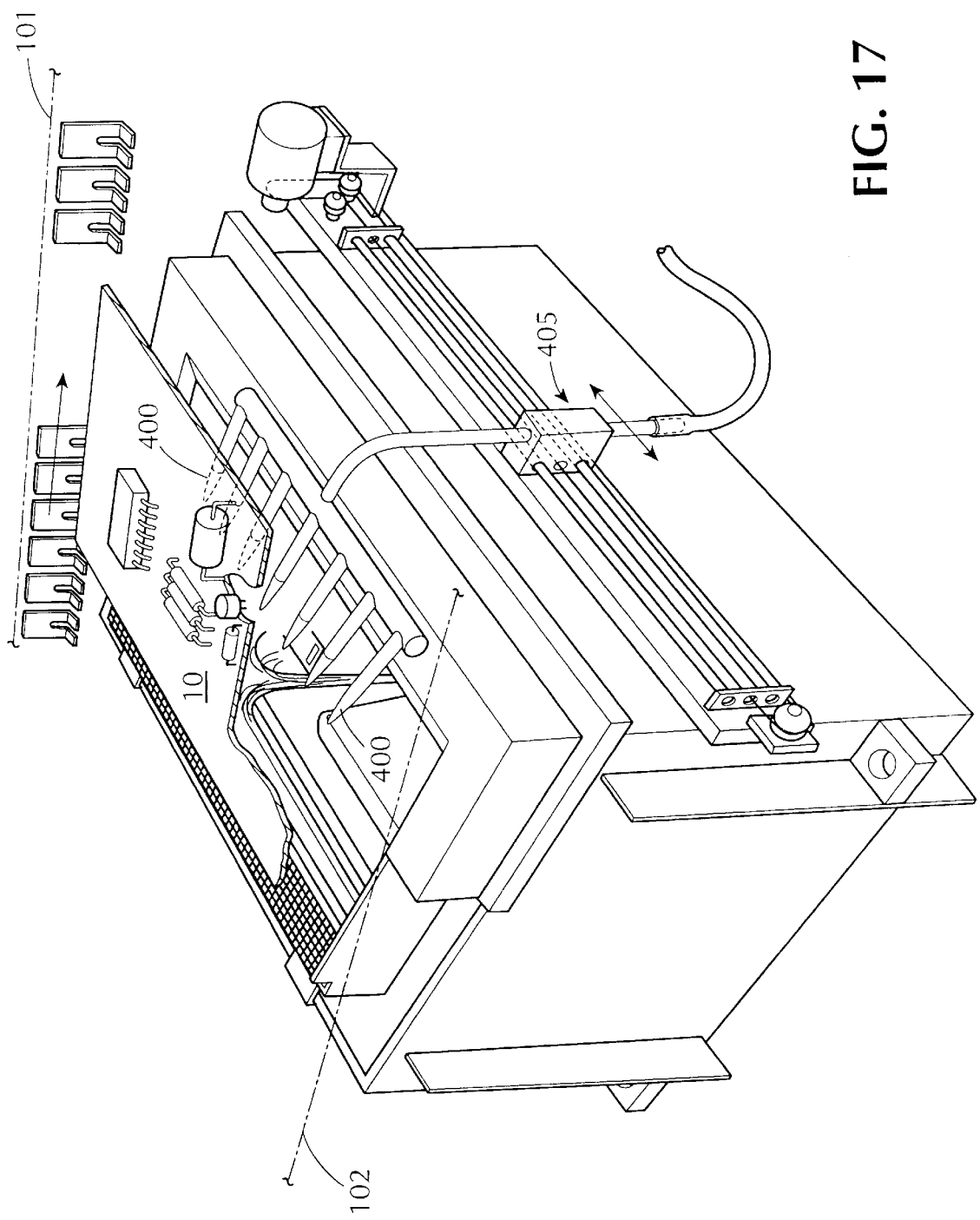
FIG. 17 is a partially cutaway, perspective view of a further embodiment of the present invention with multiple nozzles attached to a single transverse.

The selective debridging tool 140 of the present invention is mounted to the exit end of the solder pot on wave soldering station 130 (FIG. 3A). The selective debridging tool 140 may comprise one or more programmable and movable nozzle assemblies. In the embodiment shown in FIG. 4B, selective debridging tool 140 has a single nozzle assembly 250. For a typical board, one nozzle assembly should be adequate. FIG. 9 shows a similar embodiment but with two nozzle assemblies 250, 260, each having a single nozzle. Nozzle assemblies 250, 260 in the embodiment shown in FIG. 9 work in conjunction to perform selective debridging. In a further embodiment shown in FIG. 17, multiple nozzles 400 are attached to a single nozzle assembly 405. Circuit board geometry, including the positioning of where the bridges form on a particular board, will determine the precise number of nozzles and nozzle assemblies required to adequately debridge that board.

Using more than one nozzle saves travel time of the nozzles to reach the area of the board to be selectively debridged and is particularly helpful where there are many bridges to debridge on a particular board or if the board is traveling along the conveyor at a fast rate of speed. Multiple nozzles may or may not move in unison.

Figure 8:
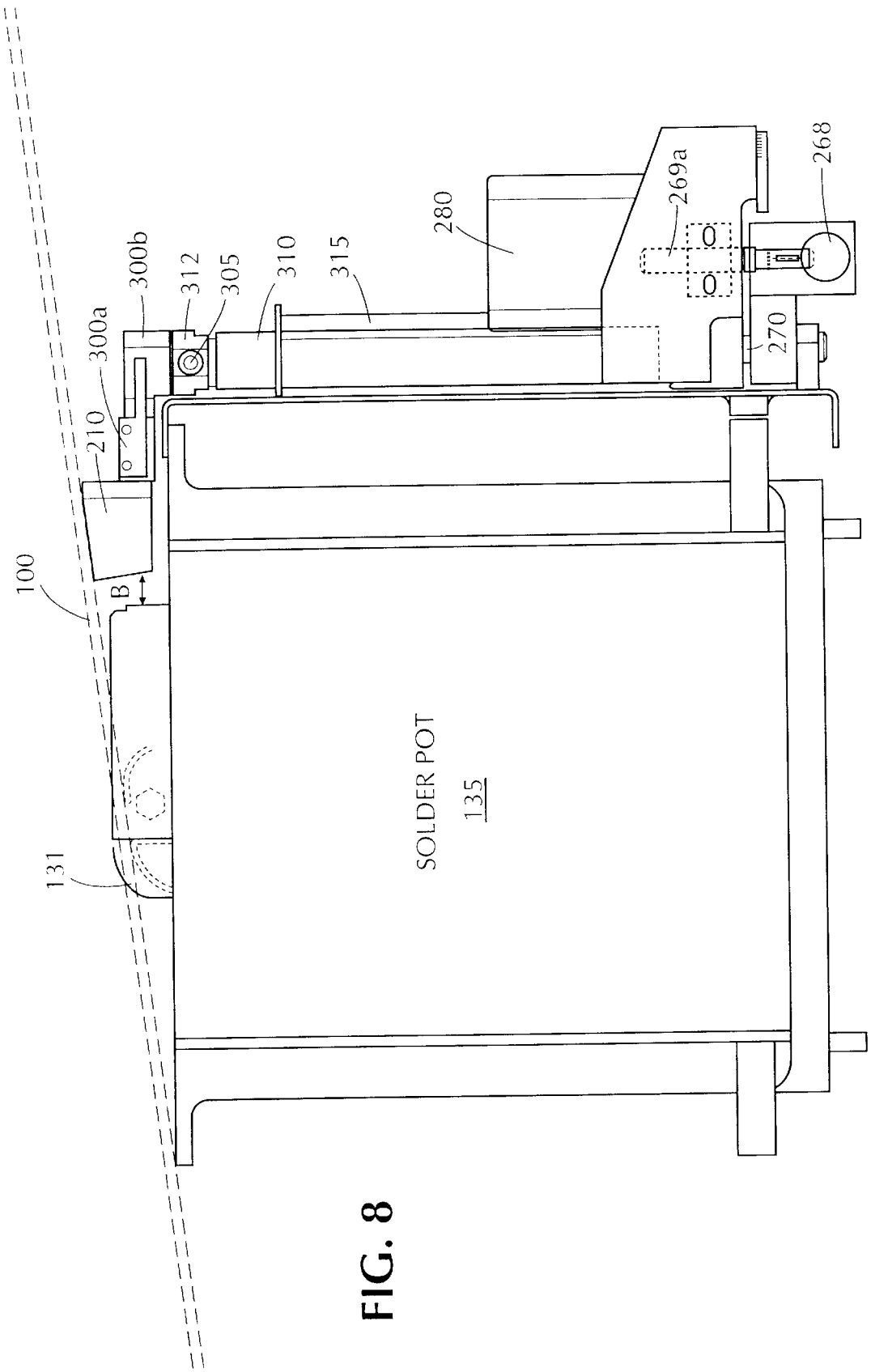
FIG. 8 is a side view of the embodiment shown in FIG. 7 of a wave soldering station and the selective debridging tool of the present invention.
Figure 14:
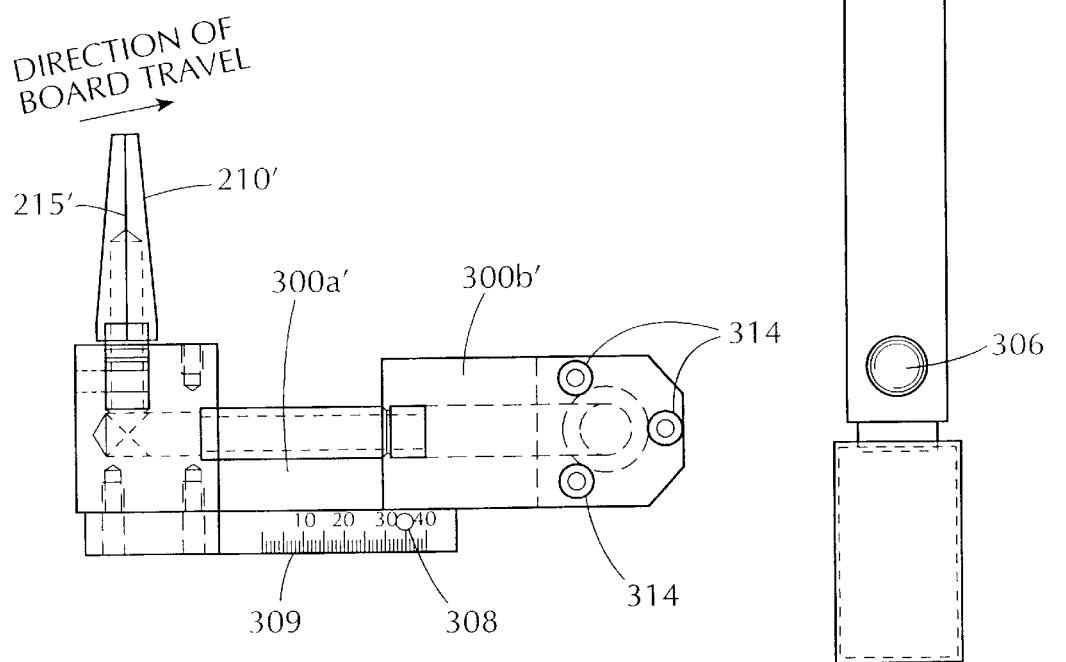
FIG. 14 is a top view of the nozzle of FIG. 13 mounted to a nozzle mount.

In the embodiment shown in FIG. 4A, nozzle assembly 250 comprises a nozzle 210, nozzle mount 300 to which nozzle 210 is screwed, a nozzle carrier mount 312 to which nozzle mount 300 is mounted with three screws 314 (FIGS. 10 and 14), and a conventional in-line heater 310 (FIGS. 8 and 11). A C-shaped plate 315 covers the back of heater 310. Heater 310 is a cylindrical heater such as the Omegalux Model No. AHPF-102, which is a 10" long pipe with an 8" heater section and using approximately 1200 Watts. The selective debridging tool further comprises a temperature sensor (or "thermo measuring device") 320, such as a resistance temperature device (RTD) or a thermocouple like the PT100. Temperature sensor 320 is inserted through a hole 305 in the nozzle carrier mount 312 between heater 310 and nozzle mount 300 or may be inserted in another suitable location in the nozzle assembly 250. A stream of air or inert gas is provided through tubing 332 and enters nozzle assembly at 306. Additional tubing branches off from tubing 332 and enters inlet 307 to pressure sensor 330. Pressure sensor 330 monitors the pressure of the air or gas stream to ensure that there is pressure and air or gas flow to the heater element when the heater 310 is turned on.

Nozzle assembly 250 is mounted to a transverse or rail 265 along which nozzle assembly 250 is movable in the x-direction. In the embodiment of FIG. 4A, nozzle assembly 250 is mounted to a channel (not shown) on the front side of transverse 265. The movement of the nozzle assembly 250 in the x-direction is controlled by computer-controlled stepper motor 280 which is coupled to nozzle assembly 250 with a belt which sits in linear axle 275.

Where there are two nozzle assemblies 250, 260 (FIG. 9), each nozzle assembly 250, 260 has a nozzle 210, 220, respectively. Each of nozzle assemblies 250, 260 is mounted to a respective transverse or rail along which a nozzle assembly is movable in the x-direction. The movement of nozzle assembly 260 is controlled by a second stepper motor (not shown).

Figure 7:
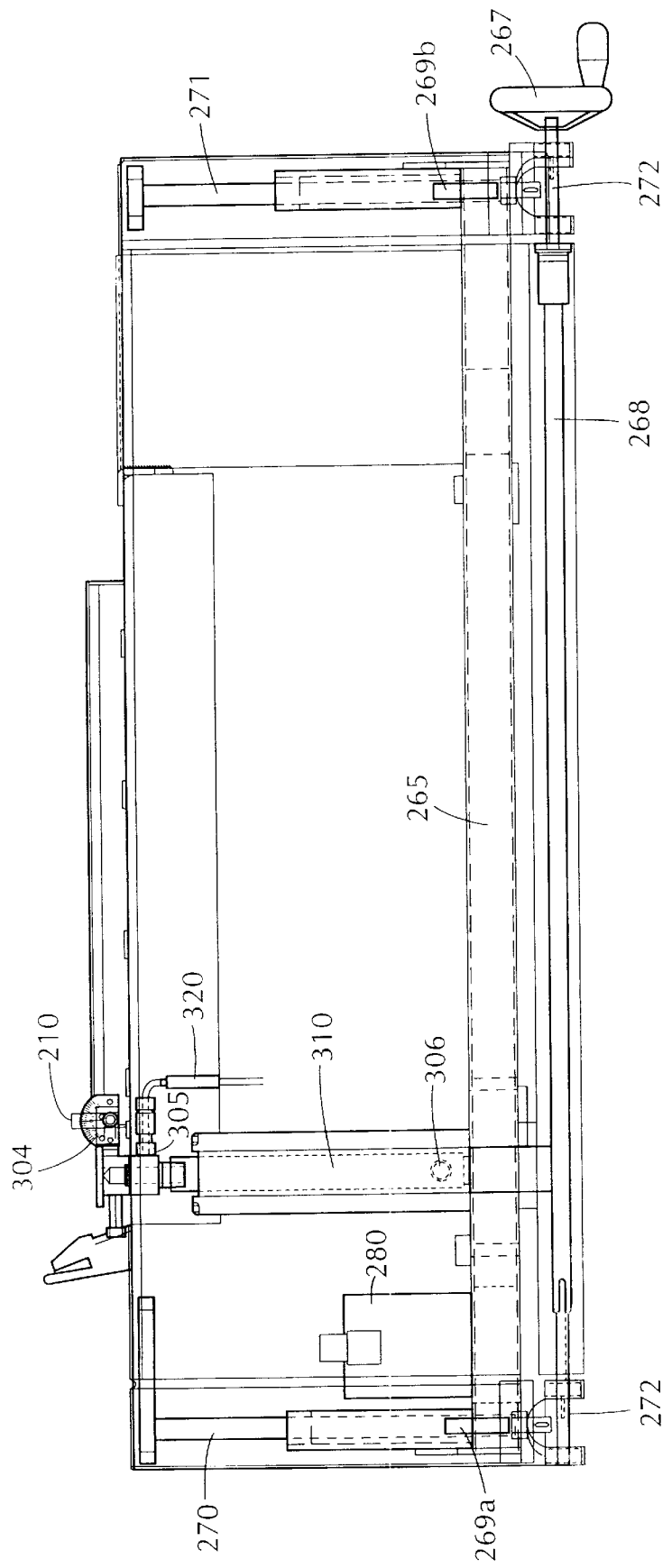
FIG. 7 is an elevational view of an embodiment of a nozzle assembly of the selective debridging tool adjustably mounted to the back of the soldering station of the wave soldering system of the present invention.

The position of nozzle 210 in the illustration embodiment is manually adjustable up and down in the z-direction by adjusting the height of transverse 265 (FIGS. 4A and 7). Transverse 265 travels along a pair of vertically mounted rails 270, 271 that are mounted to the exit end of the solder pot upstream of wave soldering station 130. The first vertically mounted rail 270 is mounted at one end of the back of the solder pot and the second vertically mounted rail 271 is mounted at the opposite end. A rotatable height adjustment handwheel 267 on the side of the selective debridging tool is coupled to a lead screw 268 which extends over the width of the selective debridging tool in the x-direction. Lead screw 268 is in turn coupled with gears 272 to vertical rotating threaded shafts 269a, 269b, one shaft 269a adjacent rail 270 and the other shaft 269b adjacent rail 271. Thus, the height of transverse 265 is manually adjustable by turning handwheel 267. The adjustment may be automated by attaching a motor to lead screw 268. While handwheel 267 is shown on the back of the wave soldering system, for the convenience of the system operator, handwheel 267 may be moved to the opposite side of the selective debridging tool, which is the front of the wave soldering system.

Where there are two nozzle assemblies each having its own transverse, the second transverse is similarly connected to permit the height adjustment of the second nozzle assembly as well.

The distance between nozzle 210 and the wave(s) in wave soldering station 130 in the y-direction is likewise manually adjustable with a slide and set screw 308. A ruler 309 may be formed on the side of the nozzle 210 to simplify the adjustment (FIG. 10) The distance between the nozzle 210 and solder wave should be kept to a minimum so as to selectively debridge the board while the board is still retaining latent heat from the solder wave. Thus, pressures could be kept lower than would otherwise be necessary if some heat from the solder wave had dissipated. However, nozzle 210 must not be placed too close to the wave or angled so as to disturb the wave because this could cause additional bridging and/or misses, i.e., no soldered joint would form. For example, having the debridging nozzle directed into the solder at excessive flow/pressure would disturb the interface area where the board exits the wave.

If desired, nozzle 210 may be made rotatable over angle $\theta$ (FIGS. 4A, 4B) about the z-axis (a "pitching" motion) by coupling a motor to a drive shaft (not shown) on nozzle assembly 250 with gears such as worm gears or other suitable gears. This rotational movement may occur either before or during debridging, as necessary.

Figure 15:
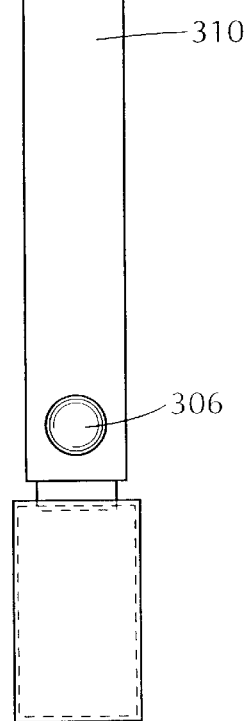
FIG. 15 is a side view of the nozzle assembly of FIG. 14 (including the in-line heater) with the nozzle positioned perpendicularly to the direction of travel of the board and the orifice of the nozzle orifice rotated sideways and pointing in the direction of travel.
Figure 16:
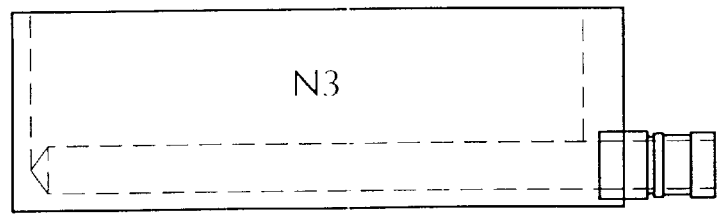
FIG. 16 is an elevational view of an elongated nozzle which may be substituted for either of the nozzles shown in FIGS. 10 and 12.

Adding further flexibility, nozzle 210 may also be manually adjusted over angle $\phi$ about the y-axis. (FIGS. 12 and 15). A protractor 304 may be provided on nozzle mount 300 adjacent nozzle 210 to assist in adjusting nozzle 210 over angle $\phi$ (FIGS. 7, 12, 15). The top of protractor 304 may be cut off if it interferes with the operation of the selective debridging tool. A ratchet or index (not shown) may also be provided to permit the adjustment of the nozzle over angle $\phi$ degree by degree.

The various configurations of nozzle 210 for debridging particular circuit boards may differ from board to board. The nozzle should be designed such that the nozzle orifice will be brought as close as possible to the board to reduce the amount of energy needed to heat the air or inert gas and to minimize the pressure of the air required to debridge or to remove excess solder, as discussed below. Generally, the nozzle may be brought less than 10 mm away from the board, as long as there is no interference from leads or hardware on the board. To allow for various nozzle configurations, nozzle 210 may be removable (by removing screws 314) and replaceable with nozzles of different configurations.

As illustrated in FIG. 4A, nozzle mount 300 may comprise multiple sections 300a, 300b that are screwed together to form a single piece that is removably attached, as with threaded connections, to in-line heater 310. Section 300a is positioned such that the nozzle orifice is positioned lengthwise in the direction of travel of board 10. This embodiment has been found to provide the best coverage for debridging a typical board.

Figure 4B:
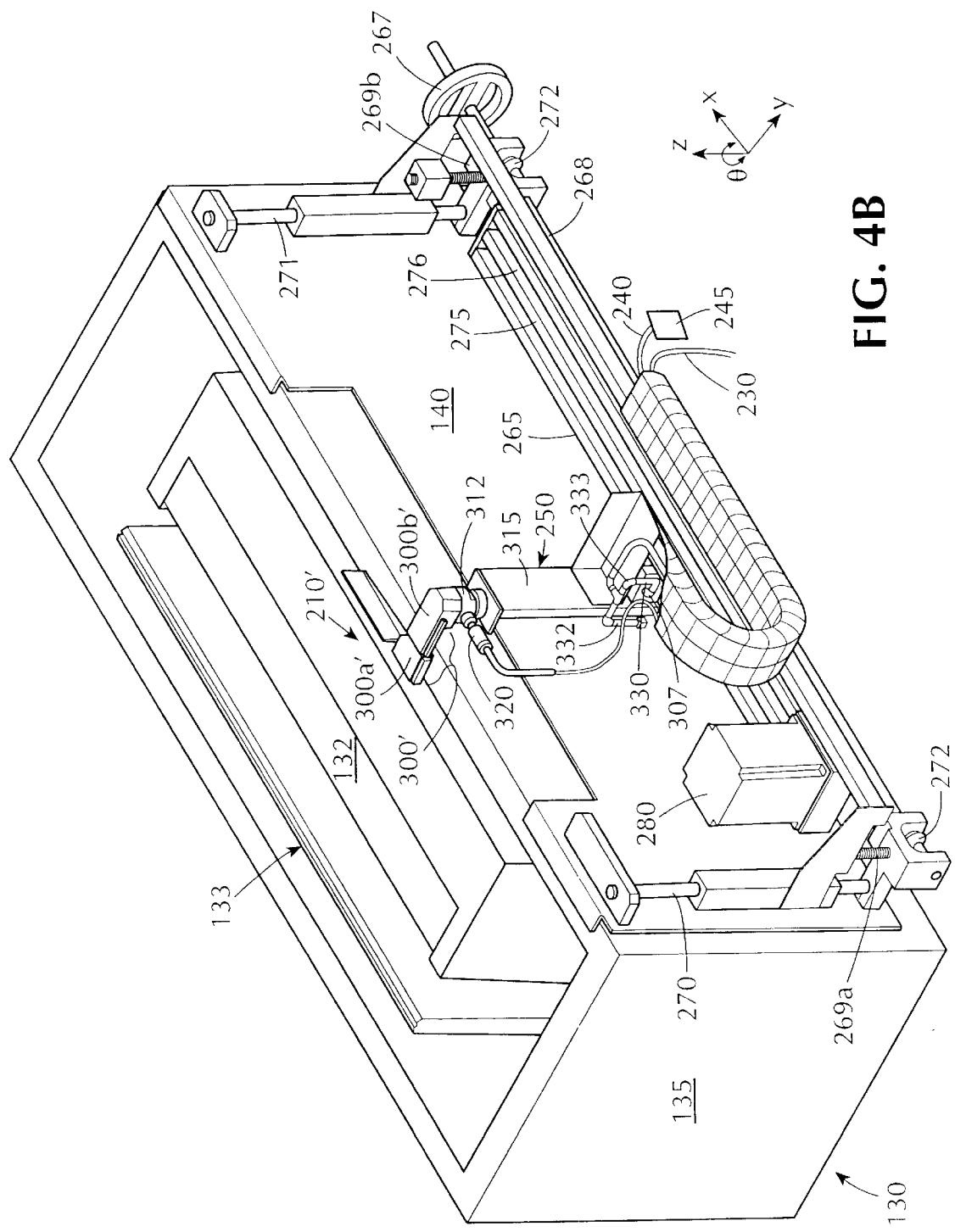
FIG. 4B is an isometric view of an embodiment of the soldering station of the wave soldering system and the selective debridging tool of the present invention with a single nozzle assembly including a nozzle, as shown in more detail in FIGS. 13–15, attached to the selective debridging tool such that the nozzle is perpendicular to the direction of travel of the board.

FIG. 4B illustrates another embodiment which is identical to FIG. 4A except for the nozzle 210' and nozzle mount 300' which has been substituted for nozzle 210 and nozzle mount 300. Nozzle mount 300', also comprising multiple sections 210a', 210b', is designed to position the orifice of nozzle 210' lengthwise perpendicularly to the direction of travel of board 10 and perpendicular to conveyors 101 and 102.

Where the conveyor is sloped upwards from the entry to exit sides of the wave soldering system and N1-type nozzle 210 is used, the upper surface 350 of nozzle 210 is trapezoidally shaped with an upward slope in the direction of the conveyor substantially equal to the slope of the conveyor as shown in FIG. 11. For ease of reference, the trapezoidally-shaped nozzle will be referred to as an N1-type nozzle. For example, if the slope of the conveyor is 7 degrees, the slope of the upper surface of nozzle 210 is designed to be 7 degrees also. This permits the air or inert gas emitted from orifice 215 to uniformly contact board 10 as closely as possible to board 10, due to the upward slope of the conveyor system 100. This trapezoidally-shaped nozzle, for example, debridges SOIC 31 (FIG. 2A) as rapidly as possible in a sloped conveyor system since SOIC 31 is positioned lengthwise along the y-axis with the front edge 60 of board 10 extending across conveyors 101, 102.

Figure 13:
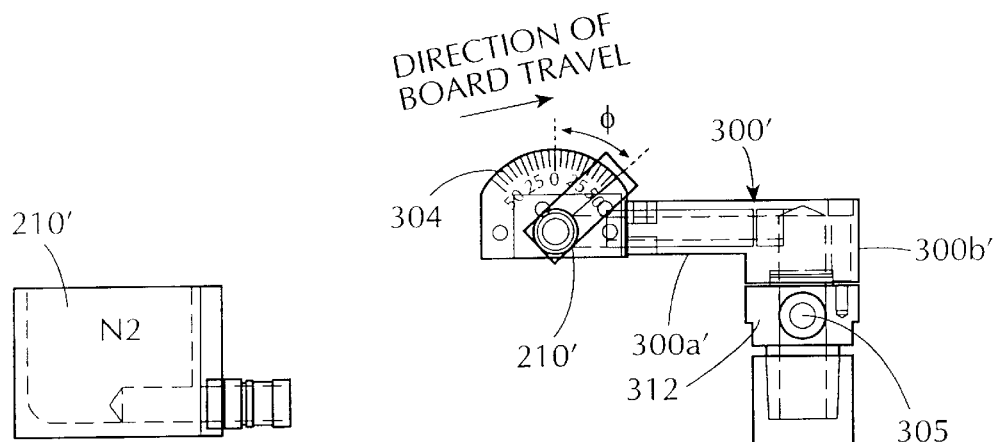
FIG. 13 is an elevational view of the second, rectangularly-shaped nozzle which is an alternative to the nozzle of FIG. 10 with the axis of the nozzle positioned perpendicularly to the direction of travel of the board.

Instead of using a trapezoidally-shaped N1-type nozzle, nozzle 210' may be rectangularly-shaped (FIG. 13), permitting nozzle orifice 215' to be as close as possible to board 10. For ease of reference, this rectangularly-shaped nozzle will be referred to as an N2-type nozzle. This nozzle shape rapidly debridges components, such as SOIC 30, positioned lengthwise along the x-axis with the front edge 60 of board 10 extending across conveyors 101, 102.

Ultimately, nozzle 210 or nozzle 210' may be positioned in any manner which is best suited to debridge a selected portion of board 10.

Nozzles 210 and 210', regardless of their shape, may be short (FIG. 7) or long (FIG. 12). For ease of reference, a long, rectangular nozzle will be referred to as an N3-type nozzle. The length of orifices 215, 215' is in the range of 8 mm–100 mm, depending on the board configuration. A preferred length of an orifice on a short nozzle, such as N1-type and N2-type nozzles, is 40 mm. If the orifices are made longer than 100 mm, blasts of air or inert gas from the selective debridging tool cause board 10 to cool too greatly before the debridging process is accomplished. One possible width of the orifices 215 and 215' is approximately 0.5 mm.

As explained above, in the embodiments shown, the ranges over which nozzle angles θ and φ, the distance between the nozzle and the board and the distance between the nozzle and the wave are manually adjustable over varying ranges which depend on the nozzle used. Table I below indicates the possible ranges for nozzle configurations N1 (positioned as shown in FIG. 4A), N2 (positioned as shown in FIG. 4B), and N3 (positioned as nozzle N2 in FIG. 4B) when used in Vitronics Soltec's Delta Wave or Delta Max systems. In other embodiments which are not illustrated, the adjustments may be automated.

TABLE I

Figure 5:
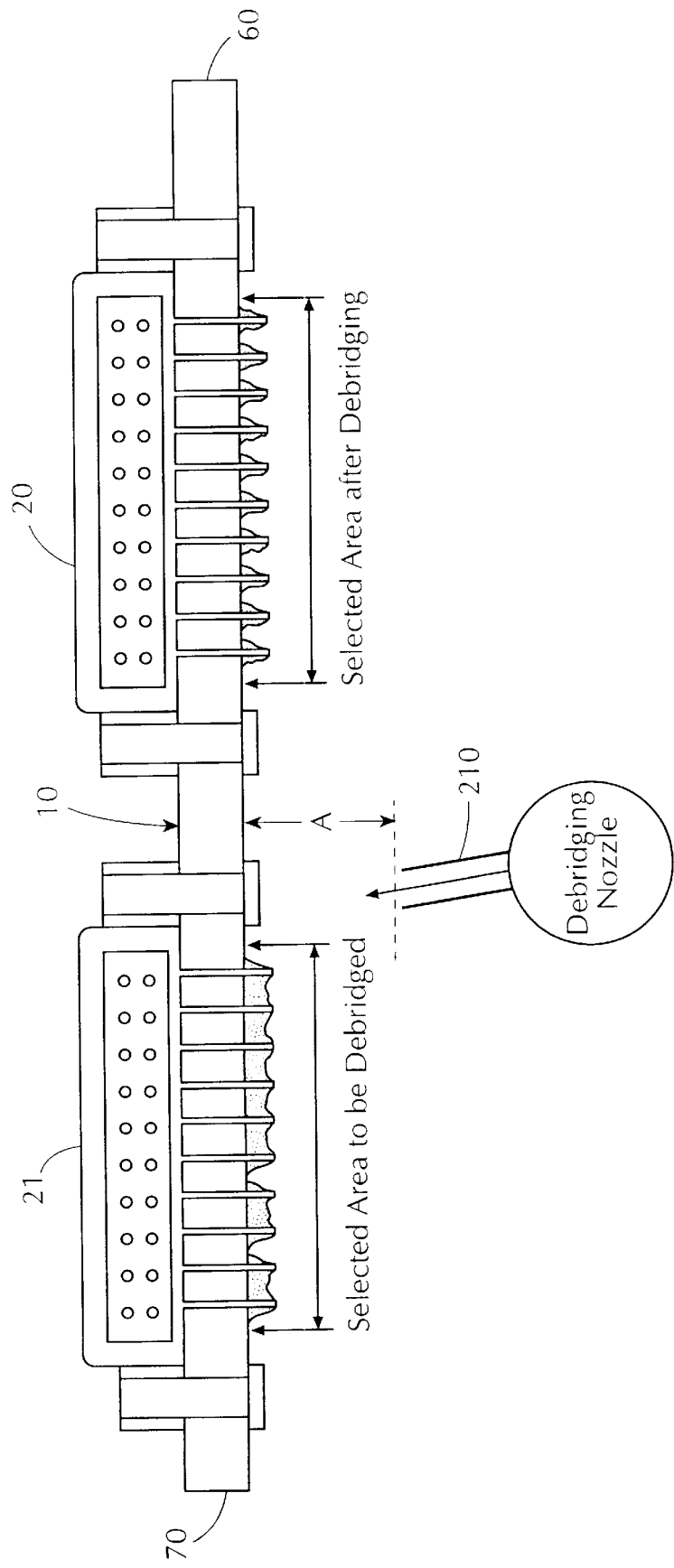
FIG. 5 is a front view of the board illustrating the D-Sub connectors after one of the D-Sub connectors has been debridged using an embodiment of the present invention.

| | |
|---|---|
| Nozzle distance from board A (FIG. 5) (typically 7 mm) | N1: 5–10 mm |
| | N2: 1.5–20 mm |
| | N3: 1.5–20 mm |
| Nozzle distance to Wave B (FIG. 8) | N1: <15 mm |
| | N2: 0–40 mm |
| | N3: 0–40 mm |
| Nozzle angle φ * | N1: 50-0-50° |
| | N2: 50-0-50° |
| | N3: 50-0-50° |
| Nozzle angle θ * (if this adjustment is available) | N1: 50-0-50° |
| | N2: 50-0-50° |
| | N3: 50-0-50° |

* The ranges for nozzle angles φ and θ for N1, N2 and N3 may be increased to 90-0-90°.

A second heater (or "preheater") 245 may be installed to preheat the air or inert gas before it reaches the heater 310. Like heater 310, preheater 245 would be equipped with an RTD or thermocouple measuring device for temperature control.

The electrical and air connections to nozzle assembly 210 are enclosed within two flex cable ducts, shown in FIG. 4A as duct 230 for the wires extending from heating element used for preheating and pressure sensor 330 and duct 240 for the air or inert gas tube 332. As the air or gas supplied to nozzle assembly 250 may be preheated with preheater 245, two separate cable ducts should be used to prevent temperature problems with the wiring. Cable duct 240 should be a thermally isolated tube to reduce the loss of heat as the air is forced from preheater 245 to nozzle assembly 250.

Wave soldering systems, such as the system shown in FIG. 3A, are generally adjustable to accommodate printed circuit boards of different sizes and with different layouts and types of components. (Board 10 shown in FIGS. 2A–2D is only one example.) The selective debridging tool may be similarly adjusted to accommodate the various board layouts that a manufacturer will typically mass solder. One skilled in the art is able to determine which areas of a particular printed circuit board require debridging by testing samples of each board, passing several identical boards through the soldering system and visually inspecting each board to determine whether bridges repeatedly form during all or most runs in the same place on the board. If bridges repeatedly form in one area of the board, those areas are appropriate sites for automated debridging. Although testing each board layout may seem overly burdensome, in practice it is quite feasible to determine the proper parameters for operating the selective debridging tool for a particular board layout and configuration since a manufacturer of printed wire assemblies will typically mass solder many boards of each particular layout and configuration.

Figure 18:
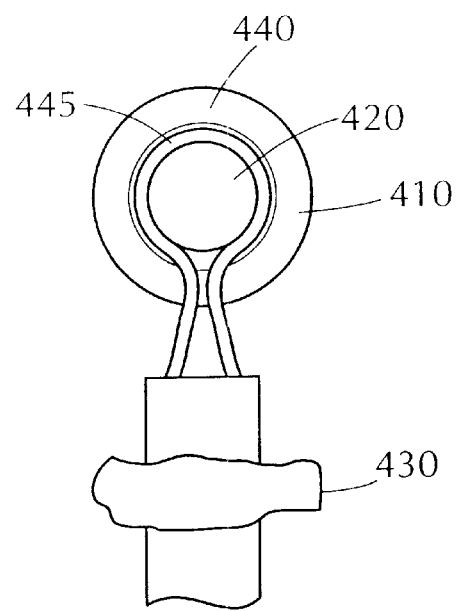
FIG. 18 is a top view of a test thermocouple welded to a lead on a printed circuit board.

As the selective debridging tool can only work successfully if the solder on the joint is still in a liquid state during debridging, the solder temperature at the area of the board to be debridged may be determined during testing to ensure that the solder remains liquid for a sufficiently long period. Referring to FIG. 18, the temperature is measured at the joint of interest with a thermocouple 410, such as a quick-response K-type thermocouple. The thermocouple 410 is welded with a soldering iron to the lead 420 of the joint to guarantee a good thermal contact. A thermocouple wire thickness of 0.2 mm is sufficient, although thinner wires may be used for more accurate measurement. The thermocouple 410 can be glued to the board at approximately 3 mm from the measuring point, at 430, to ensure the thermocouple 410 will hold during wave soldering. A more accurate measurement may be obtained by hooking the thermocouple 410, if possible, around the lead 420 of the joint to be measured so as to bring the thermocouple 410 as close to the lead 420 and solder pad 440 as possible. The mass of the thermocouple is minimized by cross welding the thermocouple wires at 445.

In determining whether or not debridging with the selective debridging tool is feasible, debridging may be attempted even if the measured temperature is too low because the temperature on solder bridges cool down at a slower rate than might be indicated at a single joint.

Another consideration in testing the temperature of a joint with a thermocouple is that the output signal of the thermocouple will be affected when the uninsulated thermocouple wires are outside the thermocouple weld and contact an electrical conductor. The parallel electrical bridge which will be formed changes the thermo-EMK and therefore the measured temperature. The measured temperature is generally lower than it actually is. This is, however, a reproducible failure, for which one can compensate.

Figure 19:
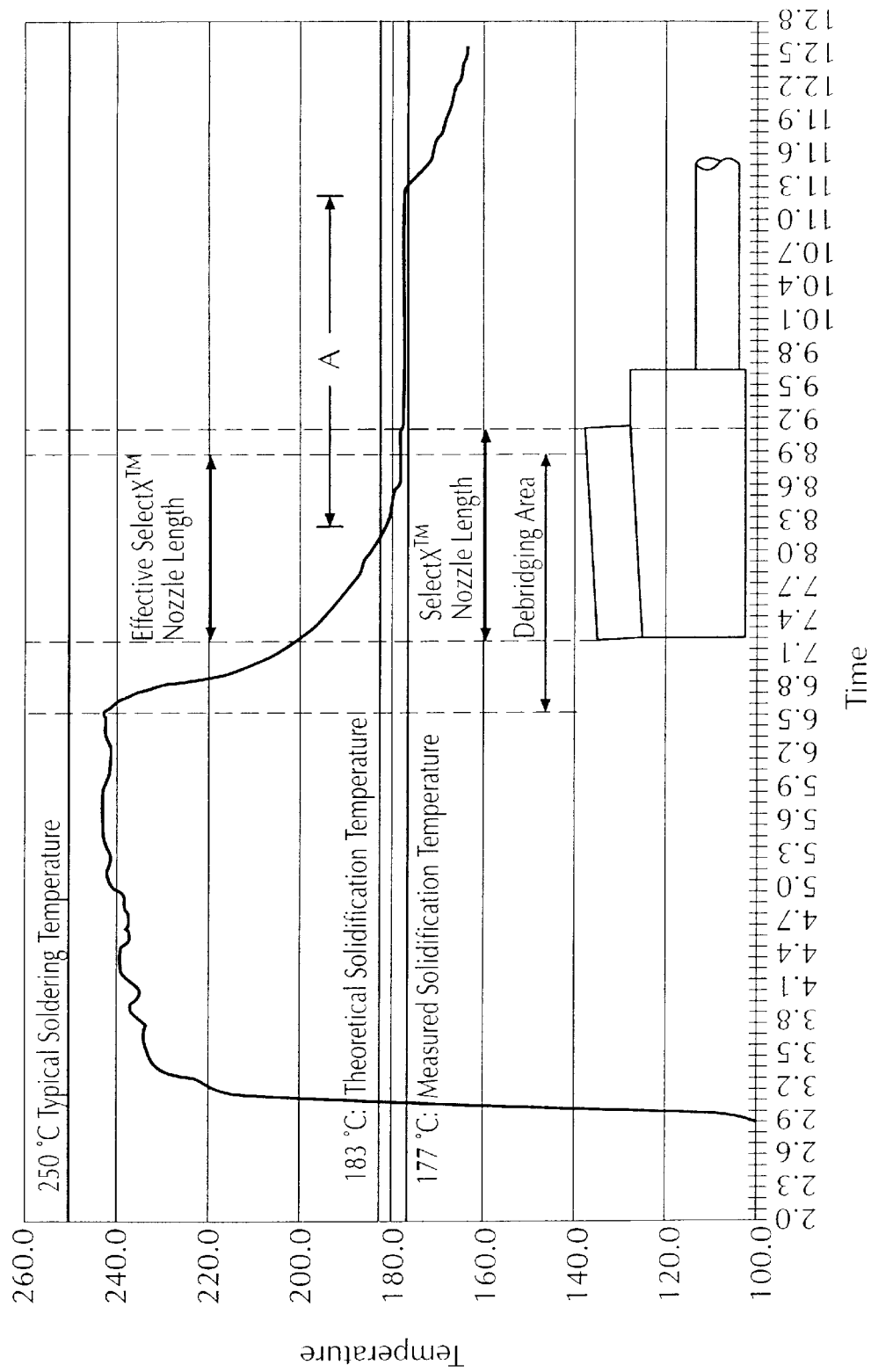
FIG. 19 is a graph of the changing temperature of a lead as the lead moves above the solder wave and the selective debridging tool.

The graph in FIG. 19 plots the temperature of the soldered joint (using standard 63/37 tin/lead solder alloy) versus time as the joint passes over the main solder wave 132 and then over the selective debridging tool, as recorded with a standard Datapaq. The best reference point in the temperature curve is the temperature at the point where the joint enters the main solder wave 132. The temperature is elevated to approximately 240° C. during soldering and drops off after exiting the solder wave. As it reaches the rear of the nozzle, the temperature levels off to approximately 183° C. in the "flat area" labeled A, which indicates that the solder is solidifying. As can be seen from the graph which shows a solidification at 177° C., the measured temperature during the solidification may vary slightly from 183° C. The length of the area A during which solidification occurs varies, depending on the thermal mass and the cooling rate of the measured joint. After solidification, the temperature of the joint cools further.

In order to plot the illustrated graph, the distance between the nozzle of the main wave 132 and the front of the nozzle of the selective debridging tool is recorded in computer 170. Also recorded is the actual nozzle length of the selective debridging tool and the conveyor speed. From the graph, it is evident that it is important to fix the nozzle of the selective debridging tool as close to the back plate of the main wave as possible in order to enlarge the "process window" for debridging while the solder is still liquid and while the board is retaining latent heat from the solder wave.

Once the area or areas to be targeted are ascertained, additional testing is performed to optimize various parameters such that the bridges are debridged without blowing out good joints or mounting holes which cannot withstand the pressure or causing other adverse effects, such as the formation of bridges adjacent a debridged area, solder smearing, pad bridging, solder globules or solderballs (usually not a problem when $\phi=0°$), open joints, or blown-out vias.

The optimal parameters to be determined during testing include how close the nozzle must be to the board in the z direction and to the wave in the y-direction, the selected temperature of the air or inert gas emitted through the nozzle, the length of time the air or inert gas is emitted before it is turned off, the shape, size and orientation of the nozzle installed, whether more than one nozzle is required to debridge a particular board, and the independent pressure setting for each area of a board requiring debridging. It has been determined that the setting of the pressure to be applied is more significant than the temperature of the air or inert gas stream.

If testing reveals that the selective debridging tool is causing bridges to form adjacent a debridged area, it may help to enlarge the area to which the air or inert gas stream will be applied to include the critical joints in which the new bridges are formed.

Solder smearing has a tendency to occur when a bridge is formed from a large amount of solder and the nozzle moves at relatively high speeds, the temperature of the air or inert gas stream is too low, and/or the air or inert gas flow is too high. The likelihood of solder smearing increases with the use of no-clean, low activity fluxes. Solder smearing may also cause pad bridging, which are bridges between solder pads 3, where solder pads 3 are relatively large and the space between the pads is small. Solder smearing may be eliminated by reducing the nozzle speed or slightly changing the angle $\phi$.

In the illustrated embodiments, some of the referenced variables for a particular board are set manually while others, including the settings for which area or areas are to be targeted by the selective debridging tool, are programmed into the computer. Based on the tests for bridge formation, the settings that are automatically controlled are programmed into the computer and saved into a "recipe" (or "menu") which is later selected whenever the board corresponding to the recipe is to be debridged. If necessary, such as where a user wishes to debridge several variations of a particular board configuration, a number of submenus may also be saved in software for each board. Many of the variables which are manually set may alternatively be automated, with various modifications to the selective debridging tool, and included as variables in the recipe.

The use of either air or an inert gas is manually selectable. Depending on the type of flux chemistry used, the inert gas used may be nitrogen.

To operate the selective debridging tool, the manual adjustments necessary to optimize the debridging operation for that board are made, the recipe for that board is selected on the computer, and the software switch on computer 170 for the selective debridging tool is turned on. This causes the selective debridging tool to enter standby mode, settings for which are included in the recipe.

In standby mode, the nozzle remains in the designated park position. The air or gas flow is controlled by an automatic flow control valve (not shown) which is opened to maintain the standby flow at a standby setpoint. One suitable valve is manufactured by Burkert of Germany and sold as Proportional Valve Type 2821 with Electronic Control Module Type 1094. This setpoint is typically only a portion of the flow when the selective debridging tool performs debridging and is designed to prevent the burn-out of in-line heater 310. After the air or gas flow begins, in-line heater 310 heats the air or gas stream to the actual recipe temperature setpoint, as measured by thermo measuring device 450, which is the temperature required for debridging.

Once the stream is heated to the desired temperature, a board 10 may be inserted into the wave soldering system. Infeed sensor 105 (FIG. 3A), such as an optical sensor, incorporated into the entrance end of conveyor system 100, senses the board 10 and notifies computer 170. The location of board 10 as it moves along conveyor system 100 is tracked by an encoder of a type well-known to those skilled in the art, such as an electromagnetic or optical encoder (not shown). The encoder 107 (FIG. 3B) is incorporated into conveyor system 100 and tracks how far board 10 has traveled by generating pulses indicative of the distance conveyor 100 has moved. These pulses are tracked by a central controller (not shown) for the wave soldering system and the distance traveled by the board is transmitted to computer 170. The user must specify in the recipe the distance between the front of the selective debridging tool nozzle and infeed sensor in order to track when the board reaches the nozzle (FIG. 6).

Figure 35:
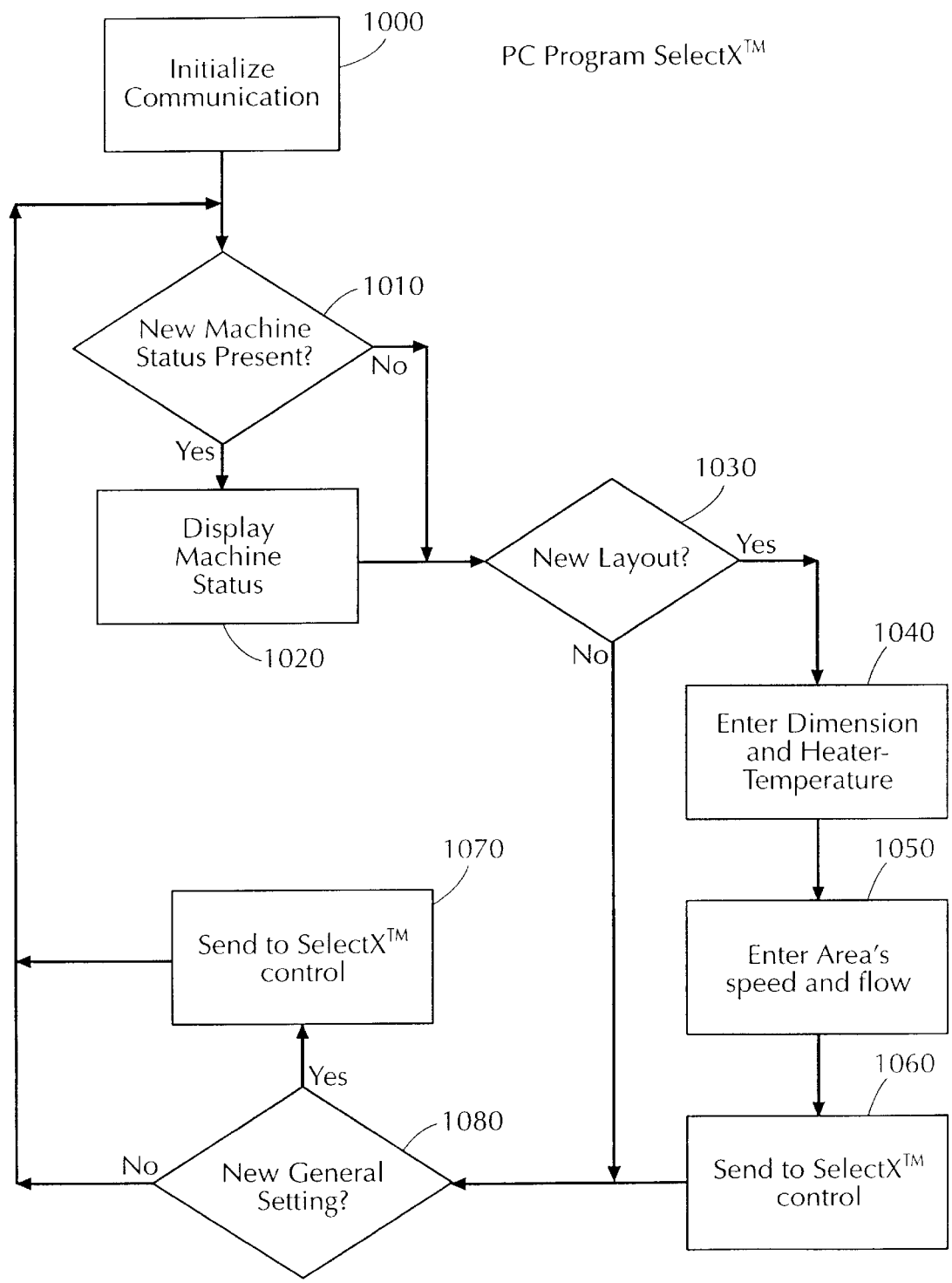
FIG. 35 is a flow chart of the algorithm followed by computer 170 for operating the selective debridging tool.

Computer 170 functions as the interface between a user and the low-level CDS controller 160 that controls the operation of the selective debridging tool. FIG. 35 is a flow chart of the steps carried out by computer 170 for operating the selective debridging tool. When the selective debridging tool is switched on, computer 170 initializes communication with the CDS controller 160. Controller 160 and computer 170 communicate via an RS232 serial port on computer. At step 1010, computer 170 determines whether the Machine Status has changed, meaning whether the selective debridging tool has been changed in any way, such as a change in nozzle. If the status has changed the new status appears on the display of computer 170 at step 1020. If the status has not changed or after the new status has been displayed, at step 1030, the computer queries the user whether there is a new board layout for which information for selective debridging must be entered. The new board layout may be a change in the layout of an existing board or a layout in a new recipe that has been entered. If there is no new layout, the computer proceeds to step 1080. If there is a new layout, at step 1040, the user must enter information as to the dimension of the new board and the set-point temperature of the air or inert gas stream, which will determine the amount of power supplied to heater 310. At step 1050, the user identifies the locations of the areas to be debridged, the nozzle speed (both forward and reverse) and the flow rate for debridging. The information entered at steps 1040 and 1050 is then transmitted to CDS controller 160 at step 1060. The distance traveled by the board, as tracked by the central controller for the wave soldering system, is also transmitted from computer 170 to CDS controller 160. Controller 160 is thereby able to track the position of board 10 along the y-axis in the wave soldering system.

At step 1070, the computer determines whether there are new general settings for the selective debridging tool. The general settings are those settings that are not dependent on a particular printed circuit board, such as where is the start, stop and park positions of the nozzle and where temperature sensor 450, discussed below, is located. If there are new settings, all operations by the selective debridging tool are stopped and the new general settings are sent at step 1070 to the CDS controller 160. After transmitting the new settings, or if there are no new general settings, computer 160 returns to step 1010 and monitors any further changes.

Figure 36:
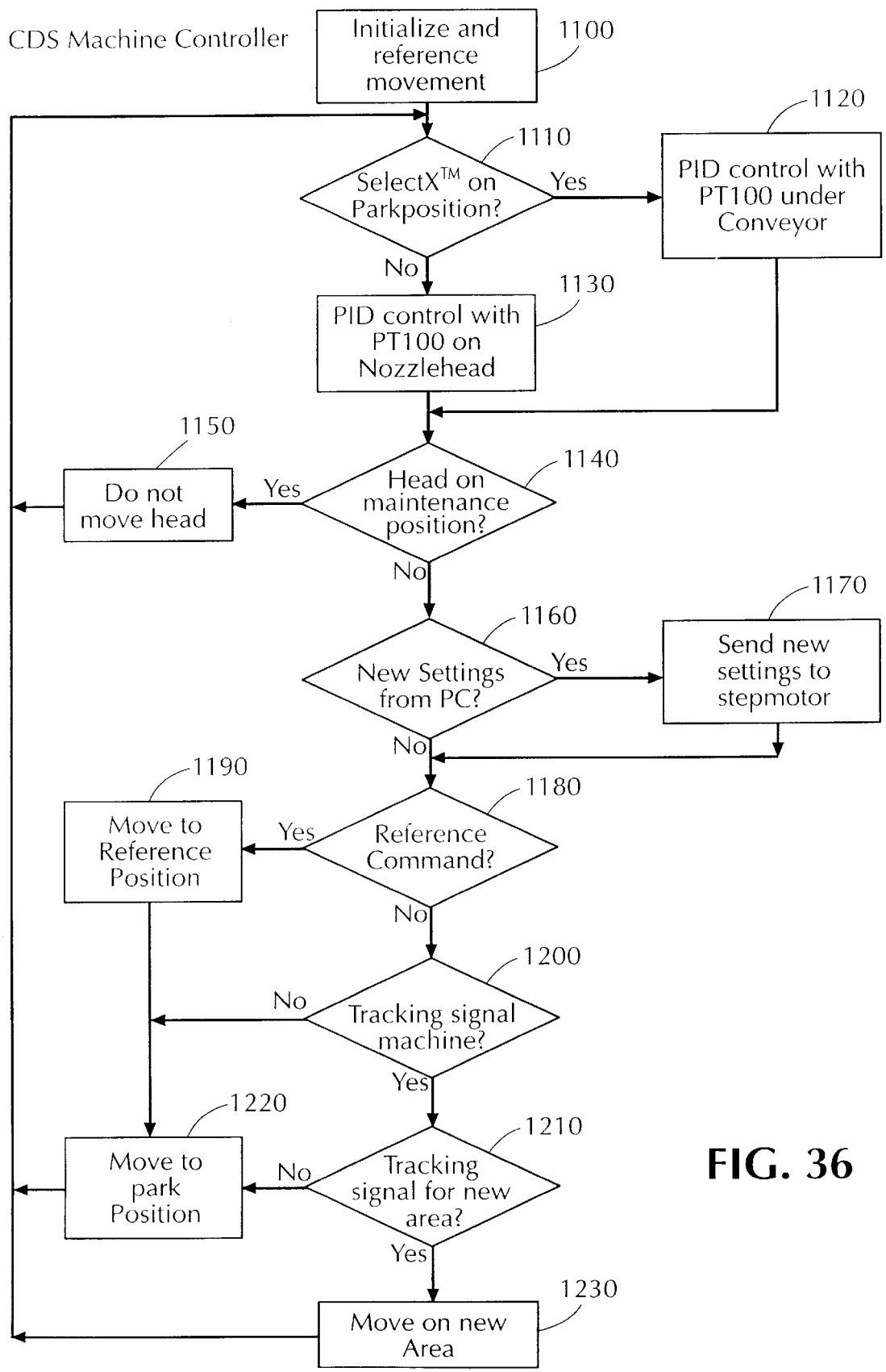
FIG. 36 is a flow chart of the algorithm programmed into the CDS controller 160.

The general operation of the CDS controller 160 is shown in the flow chart of FIG. 36. At step 1100, when the selective debridging tool is turned on, the reference points and movement of the nozzle 210 are initialized to move the nozzle to the park position. At step 1110, the CDS controller 160 determines whether the selective debridging tool is in the park position. If the selective debridging tool is in the park position, at step 1120, a PID (proportional integral differential) control in the CDS controller 160 determines the temperature of the air or inert gas stream by reading the temperature measured with sensor 450 above nozzle 210. If the selective debridging tool is not in the park position, at step 1130, the PID control reads the stream temperature using sensor 320.

The CDS controller 160 next proceeds to step 1140 where it checks whether the nozzle is at the maintenance position. The maintenance position is a position designated by the user where it is best for that user to service the nozzle. The position is entered by the user into computer 170. If the nozzle is in the maintenance position, the nozzle is held in this position at step 1150 until the user enters a command to release the nozzle. Upon release by the user, the algorithm returns to step 1110. If the nozzle is not in the maintenance position, the algorithm determines whether any new general and/or board-specific settings entered at steps 1040, 1050 and 1080 were transmitted from computer 170. If there are new settings, the CDS controller transmits the new settings to stepper motor controller 180 at step 1170. At step 1180, the algorithm determines whether there is a "reference" command, which a command issued at startup or by the user, which causes the nozzle to move a predefined "reference" position. If there is a reference command, the nozzle moves to the reference position at step 1190 and from there to the park position at step 1220.

If there is no reference command at step 1180, the algorithm proceeds to step 1200 where the tracking signal indicating that the position of a board along conveyor 100 is monitored. Controller 160 uses the information concerning circuit board dimensions entered by the user and geometry programmed into computer 170 in conjunction with the tracking signal provided by computer 170 and ultimately by sensor 105 and encoder 107 to precisely activate the selective debridging tool to target areas on board 10. If the tracking signal does not indicate that a board has reached the selective debridging tool, the nozzle 210 is moved to the park position at step 1220 (if it is not already in this position) where the nozzle waits for the board to arrive. If the tracking signal though indicates that a board has reached the selective debridging tool, the tracking signal is then monitored at step 1210 to determine if an area of the board to be debridged has reached nozzle 210. If the nozzle has arrived at an area to be debridged, the stepper motor controller 180 is notified and activated to move nozzle 210 under the appropriate area. After debridging a first area, the nozzle returns to the park position at step 1220 and returns to debridge another area, if any, at step 1230, when the tracking signal determines that another area to be debridged has arrived at the nozzle. After debridging a first board, the nozzle returns to the park position to await another board. Each time the nozzle returns to the park position, the PID control returns to monitoring the temperature of the stream with temperature sensor 450.

Figure 37:
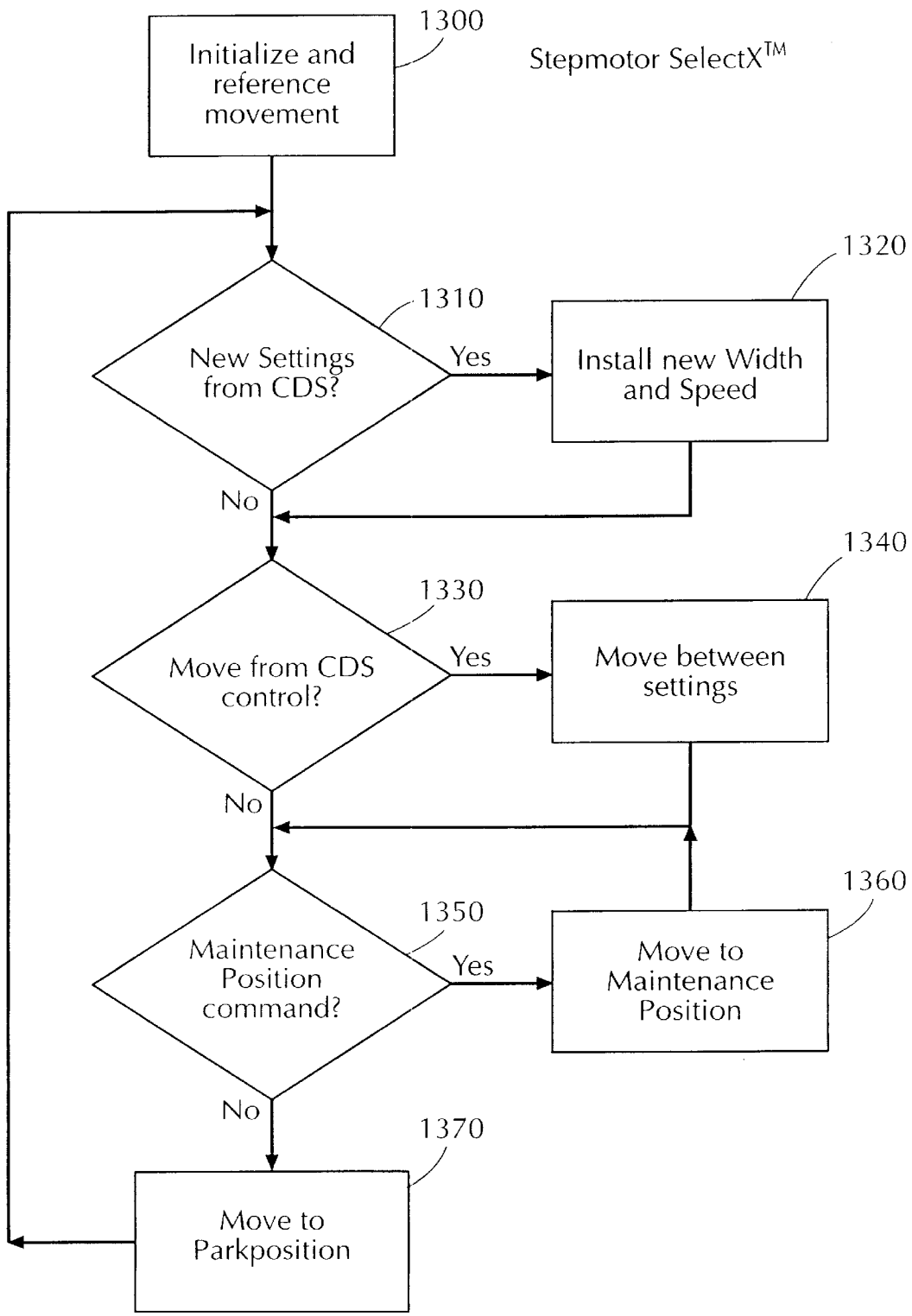
FIG. 37 is a flow of the algorithm followed by the one or more stepper motor controllers for moving the movable selective debridging tool nozzles.

FIG. 37 shows the algorithm for the stepper motor controller 180. At step 1300, upon startup of the selective debridging tool, the stepper motor 280 is initialized and referenced. After it is initialized, the stepper motor controller awaits a command from the CDS controller. At step 1310, the algorithm determines whether any new settings were transmitted from the CDS controller 160 at step 1170. If there are new settings, these settings, including the new width to be debridged and the new nozzle speed, are installed at step 1320. If there are no new settings, or after the new settings are installed, at step 1330, the stepper motor controller waits for a command from the CDS controller that the board has arrived at nozzle 210. When the board has arrived, at step 1340 the nozzle moves at the preset speed and between the preset locations to be debridged. A second stepper motor controller for a second stepper motor (not shown) would be added to transport a second nozzle assembly 260 (FIG. 9).

As board 10 passes over selective debridging tool 140, the selective debridging tool is activated with the automatic flow control activated at an appropriate time to bring the flow from the standby flow rate to the desired flow rate setpoint.

For a particular area to be debridged, the system activates the stepper motor associated with that nozzle assembly, causing the nozzle assembly to move to the start position in the x-direction specified in the recipe. The RTD with the temperature controller maintains the temperature at the actual setpoint using heater 310 to maintain the desired debridging air flow temperature. The nozzle assembly then moves from the start position over the selected area in a forward stroke toward conveyor 101 until the stop position. The forward stroke may be followed by a reverse stroke towards conveyor 102. Based on the testing, it may be determined that multiple passes over the same area with the nozzle may be necessary depending on the difficulty in debridging the area of the board.

The speed at which the nozzle moves across board 10 in the x-direction may be varied and depends on the speed of travel of the board on the conveyor. If the conveyor 100 travels more quickly, the nozzle must move at a fast speed to debridge that area in time before board 10 has passed. In one embodiment, the nozzle is operated in both the forward ("front stroke") and reverse ("backward stroke") directions at the same speed (between 0–1 m/sec). In another embodiment, the nozzle may be operated at a first speed (between 0–1 m/sec) in a forward direction and at a second speed (between 0–1 m/sec) when moving in the reverse direction.

To enhance the selectivity of the debridging process, the selective debridging tool may be programmed to operate with the air or inert gas flow turned on during both the front and backward strokes or, where mechanically feasible, with the air or inert gas flow turned on during the stroke in only one direction. With a high front stroke speed setting of, for example, 1 m/sec, it is beneficial to switch off the air or inert gas flow during the backward stroke. The speed during the backward stroke should be kept low in this case so that no joints will be skipped due to the reaction time of the proportional valve controlling the air or inert gas flow. Due to limitations of the proportional valve, it may not be technically feasible though to switch off the flow with sufficient accuracy during the backward stroke. It may also not be advisable to turn off the air or inert gas flow during the backward stroke where the effective nozzle length is small to prevent skipped areas which have not been debridged. At least some air or inert gas flow may be required during the backward stroke of the nozzle to protect the heater element and to stabilize the temperature of the air or inert gas stream.

At step 1350, the algorithm checks if a command to move the nozzle to the maintenance position is received. If this command is received, nozzle 210 moves to the maintenance position at step 1360 and stays in that position until released by another user command. At step 1370, the nozzle moves to the park position and the algorithm then loops back to step 1310.

As part of the testing procedure, the precise areas covered by the air or gas flow may be measured using thermal fax paper affixed to a sample board without any components or to a plate having the same dimensions as the board, with the sensitive side of the thermal paper facing downward. This provides insight into the use of different nozzle speeds in relation to the speed of the conveyor and area width of the board. When using the thermal paper for testing, the nozzle should be set close to the board underside, for e.g., at approximately 5 mm from the board underside, and the flow must be set at approximately 40 l/min at a heater temperature that will give a "print" on the fax paper at board level. The heaters for the solder pot 135 must be shut off, so that the machine and the solder is at ambient temperature. Also, the preheater 245 should not be activated so that the fax paper is only heated by the flow from the nozzle of the selective debridging tool. In this way, one may create thermal graphs of the nozzle behavior.

The nozzle may start, stop, or be parked or changed to a different nozzle at any appropriate place between the rails 101, 102 of the conveyor system 100 which may be spaced apart by as much as 600 mm. Generally, it is easiest to park the nozzle at a park position 600 (FIG. 20A) to the side of endless chain conveyor 101.

Another significant feature which enhances the selectivity of the selective debridging tool is that each discrete area of board 10 may be debridged at a different pressure. This allows for the selective debridging tool to be area-specific to account for various joint and component variations in the different areas of the board. Flow may be increased for debridging areas where the adhesive forces of the solder are stronger.

The air or gas flow output from each nozzle during activation of the selective debridging tool is adjustable. For a nozzle having an orifice 215 which is 40 mm long and 0.4 mm wide, the proportional valve should be set to provide a flow of 20–80 l/min. The flow should be set as low as possible to save energy and to avoid blowing out solder from via holes. In order to ensure the availability of the maximum flow, all tubes which provide air or inert gas to the debridging tool nozzle are at least 6 mm in inside diameter, and air or inert gas is input to the system at a pressure in the range of 3 to 10 bar. The amount of flow is dependent on the orifice size, with the longest nozzle having an orifice of 100 mm outputting the maximum flow in this embodiment. It is also dependent on different the particular model of proportional valve that is used. The flow strength is balanced against the distance of the nozzle from the board.

The temperature of the air or inert gas stream emitted from the nozzle is adjustable and is generally set to a temperature less than the temperature of the molten solder. For the commonly used 63/37 tin/lead solder alloy, the air or inert gas stream is preferably heated to a temperature in the range of 21° C. to 180° C. By maintaining the temperature below that of molten solder there is reduced risk that any electronic components or that the laminate on the board would be damaged by high temperatures. (The maximum setting may be limited by hardware or software to prevent board damage.) However, the invention would also work where the temperature of the air or inert gas stream is set at or above the temperature of molten solder. Because the flow has a relative cooling effect on the portion of the board it hits, it can be beneficial to set the flow temperature higher than the ambient temperature.

The temperature of air or inert gas stream is controlled with the PID control. The PID control adjusts the power supplied to heater 310 with a manual controller or computer to maintain the desired temperature. While the PID control may measure the temperature with only a thermo measuring device 320, such as a thermocouple or RTD (resistance temperature device), tests have shown that this is not advisable to rely on device 320 by itself since the temperature of the air or gas stream emitted from the nozzle orifice is 30–40° C. less than the temperature as measured at temperature sensor 320 and is somewhat inaccurate.

The temperature of the air or inert gas stream is more precisely regulated by inclusion of another temperature sensor (thermo measuring device) 450 (FIG. 20A), generally a PT100. Sensor 450 is best mounted via bracket 455 to the rear of frame 460 of the wave soldering system to maintain the same park position regardless of the position of the endless chain conveyor 101. Sensor 450 is positioned above the nozzle park position at the same distance from the nozzle as the circuit board is when the circuit board is transported by the conveyor over the nozzle, as shown in FIG. 20B.

To initially set the operator-selected set point temperature of the stream with sensor 450, the nozzle must be maintained in the park position. Heater 310 is adjusted until sensor 450 detects that the set point temperature has been reached and has stabilized. At this point, the temperature of thermo measuring device 320 required to achieve the set point temperature at sensor 450 is also recorded. The nozzle may then be moved away from the park position (and away from thermo measuring device 450) to begin debridging. Since sensor 450 does not accompany the nozzle during debridging to monitor the temperature of the stream, the temperature of the stream is monitored with thermo measuring device 320 and the software in the CDS controller uses this measured temperature to regulate the power supplied to heater 310 so as to maintain the measured temperature at the same recorded level as was required to reach the set point temperature of sensor 450 in the park position.

The desired temperature of the air or gas flow at the board may thus be constant, independent of nozzle distance from the board or flow rate. Moreover, the heater setting may only be changed when the nozzle is at the park position and the temperature sensor 450 measures a difference between the set point temperature and the actual measured temperature. In order to bring the temperature sensor 450 to a stable temperature before it begins monitoring the temperature of the flow when the nozzle returns to the park position, there should be a slight time delay before the thermo measuring device restarts its monitoring/regulating function.

By mounting sensor 450 to the frame 460 of the wave soldering system rather than to the adjustable endless conveyor 101, the park position is maintained independently of the position of endless conveyor 101, as shown in FIGS. 20A, 20B where endless chain conveyors 101, 102 are separated to their maximum width and in FIGS. 21A, 21B where endless chain conveyor 101 has been moved such that endless conveyors 101, 102 are separated by a width less than their maximum width.

The ideal temperature of the air or inert gas depends on board mass, solder temperature and transport conveyor speed. Due to the relatively low flow rate of the air or inert gas used in the selective debridging tool, large heaters are not required. Preheater 245 may be included in the selective debridging tool but is not required for operation of the selective debridging tool at a temperature below 180° C., even at a high flow setting.

As the flow from the nozzle hits the board, the flow cools the area where it is active. If the solder is cooling too fast, the selective debridging tool will be unable to remove the bridges properly. It may therefore be beneficial to set the flow temperature higher than the ambient temperature but less than 180° C.

After debridging a first area, the nozzle reenters standby mode and moves to the park position until another area on the board which it must debridge, if any, approaches. At the next area to be debridged, the nozzle will again be activated and debridge that area. This process will be repeated until all of the selected areas are debridged by that nozzle.

Where more than one nozzle assembly is used, the invention works similarly except that certain areas are debridged by the first nozzle on the first nozzle assembly and other areas are debridged by the other nozzle or nozzles on the other nozzle assemblies.

Sensor 106 (FIG. 3A), such as an optical sensor is incorporated into the exit end of the conveyor system 100 and notifies computer 170 when board 10 is at the exit of the conveyor system 100.

After debridging the first printed circuit board, if there are additional boards to be debridged, the nozzle will enter the standby mode and move to the park position until the next board arrives at the selective debridging tool.

After a run of identical boards is completed and a board with a different layout and components is to be soldered, one performs the adjustments to the manually set parameters, selects the recipe for the next board and selectively debridges that board in a similar manner.

An N1-type nozzle 210, with an orifice 40 mm long and 0.4 mm wide, has been found to achieve good results for typical board configurations even without providing any adjustment for nozzle 210 over angle θ, i.e., θ=0°. With the nozzle 210 set at φ=0° (i.e., the nozzle is pointing straight upward), the nozzle is fully symmetric in action, permitting the use of the same nozzle speed settings for the front and backward strokes. This will guarantee the optimal coverage over the board area. Also, with φ=0°, there is a maximal turbulence around the nozzle, which will remove the solder without depositing it on another area of the board. In most cases, this setting will give good results.

For certain boards, turning nozzle 210 to provide a slight angle, such as φ=10°, sometimes may be beneficial to prevent or at least reduce solder smearing. The precise angle selected is dependent on the board and the results that are obtained. If the nozzle is set under a more inclined angle, for e.g., 30°, it might be best to use different nozzle speeds for the front and backward strokes.

The nozzle speed in combination with the conveyor speed determines how long the flow can be actively applied to a certain area on the board. If the nozzle speed is too low, the nozzle will be unable to cover the whole area to be debridged, which may lead to skipped joints. Lower speeds are therefore not recommended. If the nozzle speed is too high, the flow has no time to displace the solder properly and side effects, such as solder smearing, may be introduced. The nozzle speed is also dependent on the amount of solder that has to be removed. Therefore it is not possible to specify a "standard" speed. Practical nozzle speeds can be found from 20–40 cm/s, although the speed may be as high as 45 cm/s. The nozzle speed is set at approximately 20 cm/sec for removing average size bridges. For larger areas, the nozzle speed is set higher such as at 40 cm/sec.

Although the actual length of the N1-type nozzle is 40 mm, the effective length may be smaller than the actual length, depending on the thermal behavior of the joints that have to be debridged. For this application, the effective nozzle length can be defined as that part within the nozzle area width of the selective debridging tool, where the solder is above the solidification temperature. This solidification temperature is represented by area A on the temperature curve of FIG. 19 at ~180° C. As soon as the solder starts to solidify it is not liquid anymore and therefore cannot be further removed.

The area width on the board is defined as the area dimension perpendicular to the transport direction of the board. The area length is defined as the area dimension parallel to the transport direction of the board.

The effective nozzle length and the conveyor speed are used to calculate the available time and appropriate nozzle speed for debridging the specified area width on the board. The following is an example of how to calculate the time and nozzle speed values. This example assumes that (a) the N1-type nozzle is set at φ=0°, (b) an effective nozzle length of 30 mm has been measured from the temperature curve of FIG. 19, and (c) the conveyor speed is set to 25 mm/sec (=1500 mm/min). The time that a point is covered at least once by the nozzle is:

Time=(Half of the effective nozzle length)/(Conveyor speed)=15 mm/25 mm/s=0.6 s

The effective nozzle length is halved for purposes of the computation to provide a more conservative estimate of the time, thereby guaranteeing effective coverage. To cover an area width of 16 cm, the minimum nozzle speed is:

Nozzle Speed=(Area Width)/(Time)=16 cm/0.6 s=27 cm/s

At short area lengths (<20 mm), a lower nozzle speed might also cover the full area. If the area length in the example is only 10 mm (as, for e.g., for a connector), a nozzle speed of 20 cm/s may be used. In calculating the "net width" of a board-area to be covered by the selective debridging tool, the area width set in the recipe in the PC program settings should be enlarged by ~5 mm on both sides to ensure proper coverage.

It has been found that to determine the optimal settings for debridging a particular board when using the N1-type nozzle, the parameters should initially be set for testing purposes as follows: the nozzle angle φ should be set to an initial angle of 0° depending on the board, the distance between the top of nozzle and the underside of a board should be set at approximately 7 mm, the air or inert gas flow should be set at approximately 40 l/mm for both stand-by and active flow, and the nozzle speed should be set at 20 cm/s for both the forward and backward directions (unless a higher speed is needed to cover the board area width). Next, the area or areas to be debridged are programmed into the computer 170 and a production board is tested. Given a conveyor speed which is adjustable over a range of 900–1800 mm/min, the conveyor speed should be set at between 1200–1500 mm/min.

If the bridges are properly removed during an initial test run of a test board, additional tests should be run, with the air or inert gas flow reduced on each run as long as the bridges are still being removed. If not all of the bridges are removed at the initial flow setting, or if the debridging operation is causing too many adverse effects, such as solder smearing, pad bridging, open joints, or blown-out vias, the flow should be adjusted in conjunction with the nozzle distance from the board to optimize the debridging and/or reduce the adverse effects. The distance of the nozzle from the board should not be too large, in order to prevent excessive cooling caused by the stronger flow, made necessary at greater nozzle distances, to create sufficient force to move the "liquid" solder. A small correction of the nozzle angle, keeping the nozzle within the range of between –15° and 0° may also improve the results.

When one finishes using the selective debridging tool, it is turned off. It then enters the park mode, returning the nozzle assembly 250 to its park position and switching off the heater.

The invention can also accommodate printed circuit boards or flexible circuits which are insufficiently stiff to be inserted into the wave soldering system. These boards are placed in a pallet which is inserted between spring members 103 of conveyors 101 and 102. To assist the tracking mechanism in locating areas to be debridged, the user specifies to computer 170 the offsets of the board from the edge of the pallet.

It is advantageous to both wave solder and debridge in an inert environment (where the oxygen level in the atmosphere is reduced to below 20% by the introduction of an inert gas) to prevent oxidation of the solder, particularly when the currently popular "no clean" fluxes, which are less active in preventing oxidation, are applied to the boards. To this end, the solder main wave 132, chip wave 131, if any, and selective debridging tool may be covered with an enclosure such as a modified version of the Nitro Wave™ system and/or a slightly modified version of the Nitro Hood™ system. Although the particular embodiment described below is directed to a nitrogen environment, other inert gases which create an inert environment could be used instead of nitrogen.

Figure 22A:
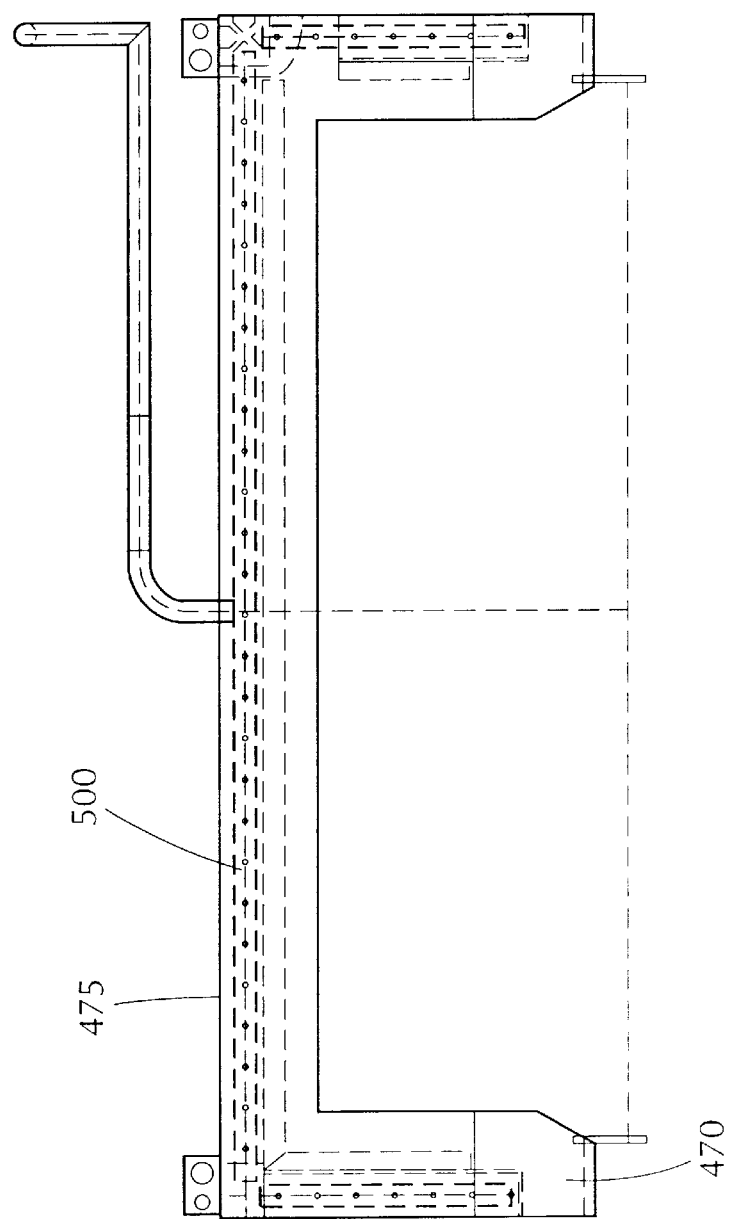
FIG. 22A is a top view of the cover of the prior art Nitro Wave™.
Figure 22B:
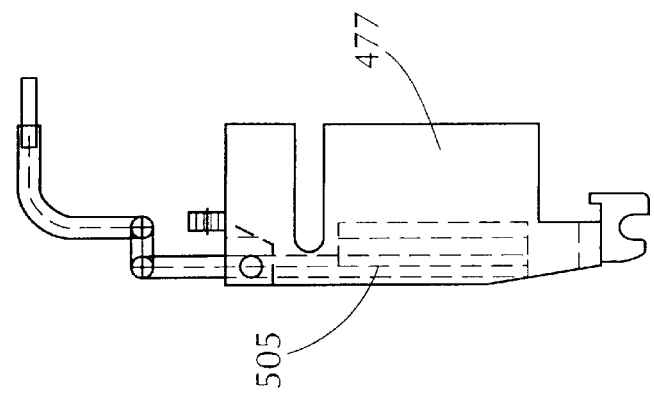
FIG. 22B is a right side view of the cover of FIG. 22A.

In the existing Nitro Wave™, a cover 470, shown in FIG. 22A, sits above the first, main soldering tower 136 and serves as a boundary to enclose the nitrogen atmosphere. The top plate of cover 470 is substantially U-shaped and extends to the rear and both sides of the main soldering tower 136. The cover 470 further has a downward extending rear wall 475 and two downward extending side walls 477. Three stainless steel gas permeable diffuser pipes, including pipe 500 and two additional pipes identical to pipes 550, 551, shown in FIG. 23, extend laterally above the soldering towers 136, 137. An additional pipe extension 505 extends perpendicularly from pipe 500 under each of side walls 477 of cover 470. The first diffuser pipe, equivalent to pipe 550, is located between the chip wave and the entrance side of the solder pot 135. This first pipe is 6 mm in diameter and has 15–30 holes (depending on the length of the pipe required) which are 1 mm in diameter and are separated from each other by 20 mm. The second pipe, equivalent to pipe 551, is located between the main wave and the chip wave. This second pipe is 10 mm in diameter and has 30–60 holes (depending on the length of the pipe required) which are holes 1.5 mm in diameter and are separated from each other by 10 mm. The third pipe 500 is located at the back of the main wave. This third pipe 500 is 10 mm in diameter and has 30–60 holes (depending on the length of the pipe required) which are holes 1.5 mm in diameter and are separated from each other by 20 mm. Nitrogen diffuses out of the holes on each of the pipes during wave soldering. The top of the board being soldered captures the diffused nitrogen as it is moved by conveyor 100 above the Nitro Wave™ so as to surround the area being soldered with nitrogen.

Figure 23:
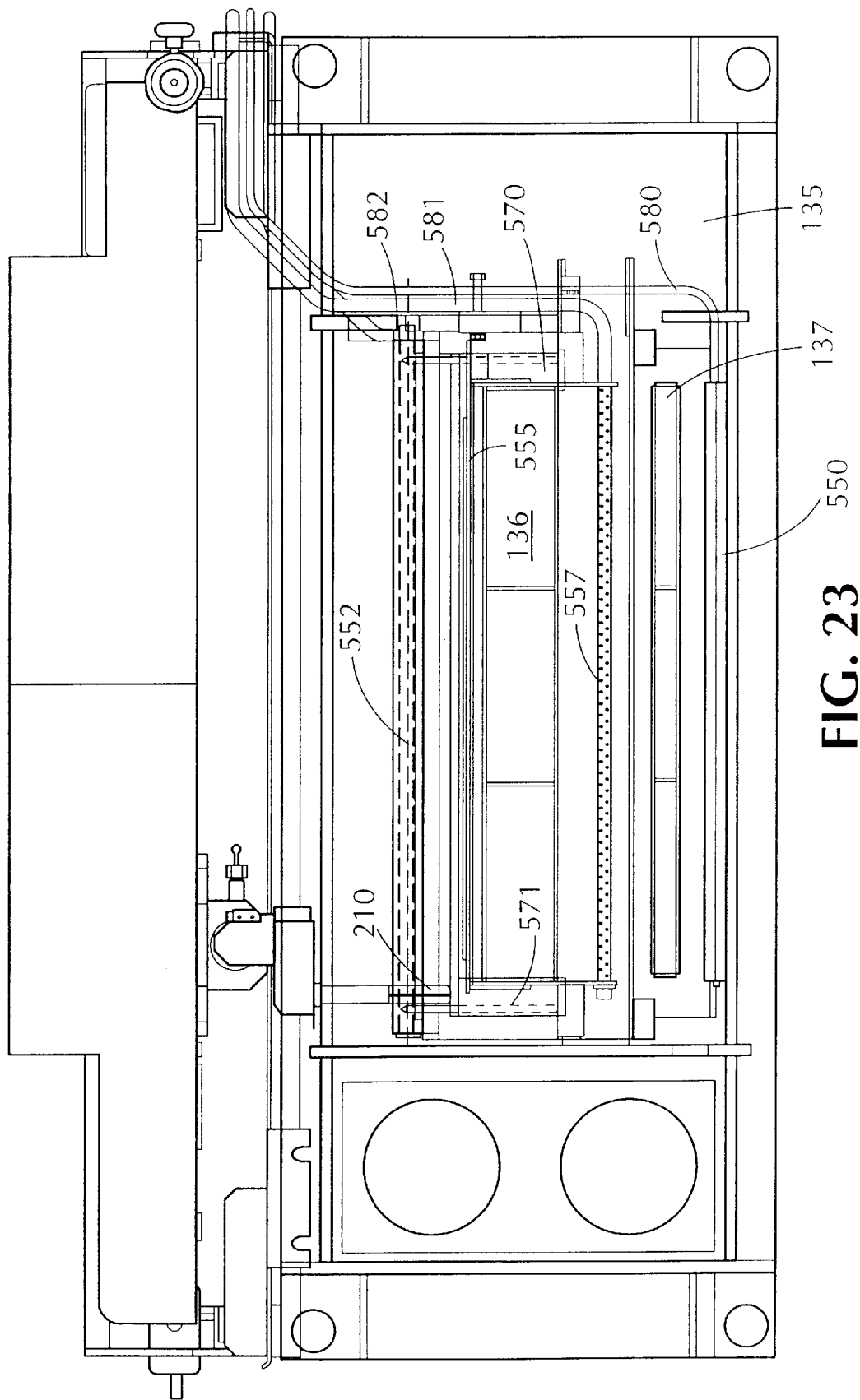
FIG. 23 is a top plan view of the combination of the selective debridging tool and a first embodiment of a modified Nitro Wave™ device for creating a nitrogen environment for wave soldering.
Figure 24:
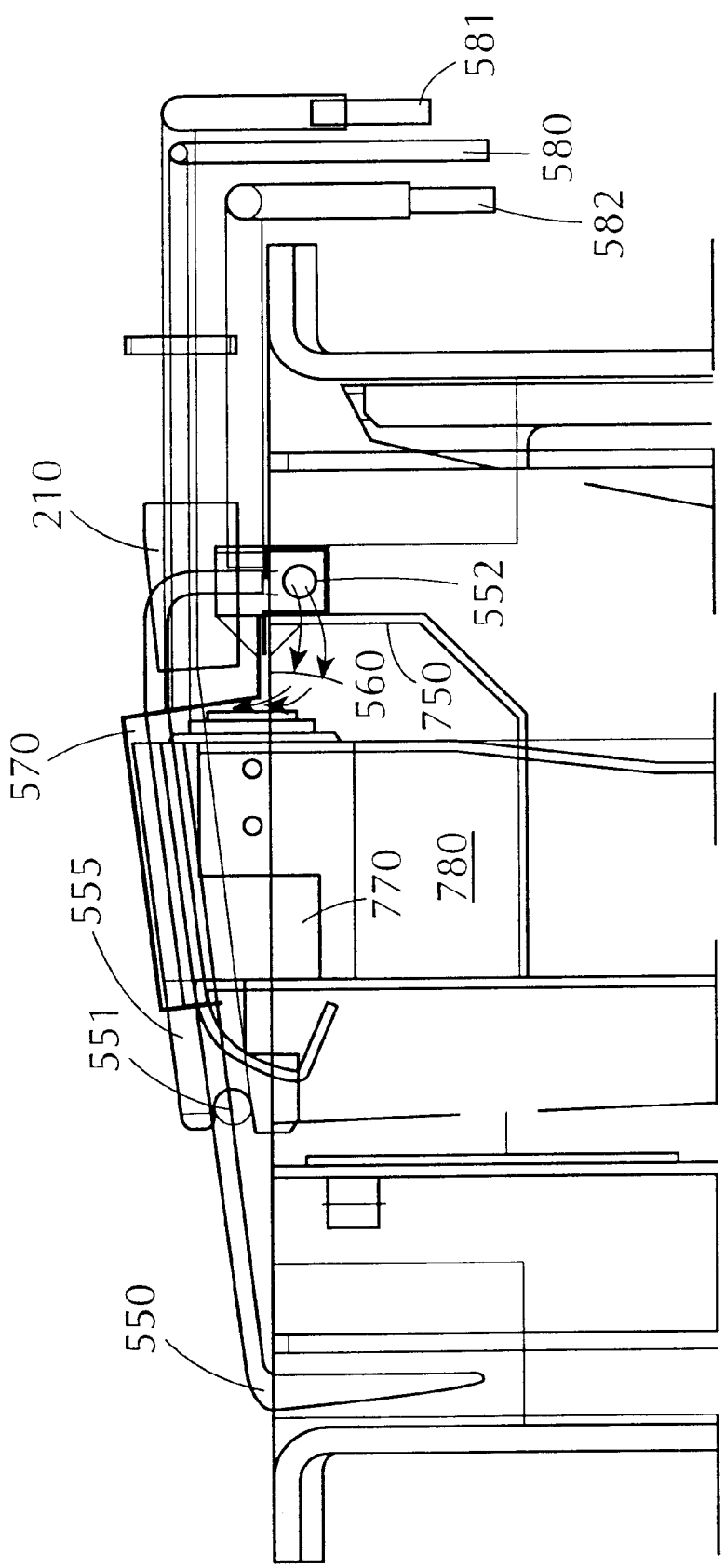
FIG. 24 is a right side view of the combination shown in FIG. 23.

The Nitro Wave™, as modified according to a first embodiment, is shown in FIGS. 23 and 24. In the illustrated first modified embodiment, the first and second diffuser pipes 550, 551 are identical to the first and second pipes in the prior art. The third pipe 552 is, however, moved rearward out from under a cover 555 and below the N1-type nozzle 210 of the selective debridging tool to avoid interfering with the selective debridging tool, which occupies the same area as the third pipe 500 of the prior art Nitro Wave™. A guide or baffle plate 560 guides the nitrogen emerging from pipe 552 to the area around the back edge of the main wave 132, as indicated by the arrows. In addition, two short diffuser side plates 570, 571 are attached to cover 555. The cover 552 and the top of the board 10 together retain the nitrogen in the vicinity of the board 10 during soldering. Nitrogen is fed to diffuser pipes 550–552 through feed tubes 580–582, respectively.

This first modified embodiment is advantageous because it retains the nitrogen blanket formed by the Nitro Wave™ close to the solder returning to the solder pot 135, thus reducing dross. However, this embodiment may be disadvantageous in that it may not be close enough to the board 10 during soldering to sufficiently minimize oxidation. It also may also pollute third pipe 552 quickly because of solder entering the holes due to pipe 552's proximity to the solder pot 135.

Figure 25:
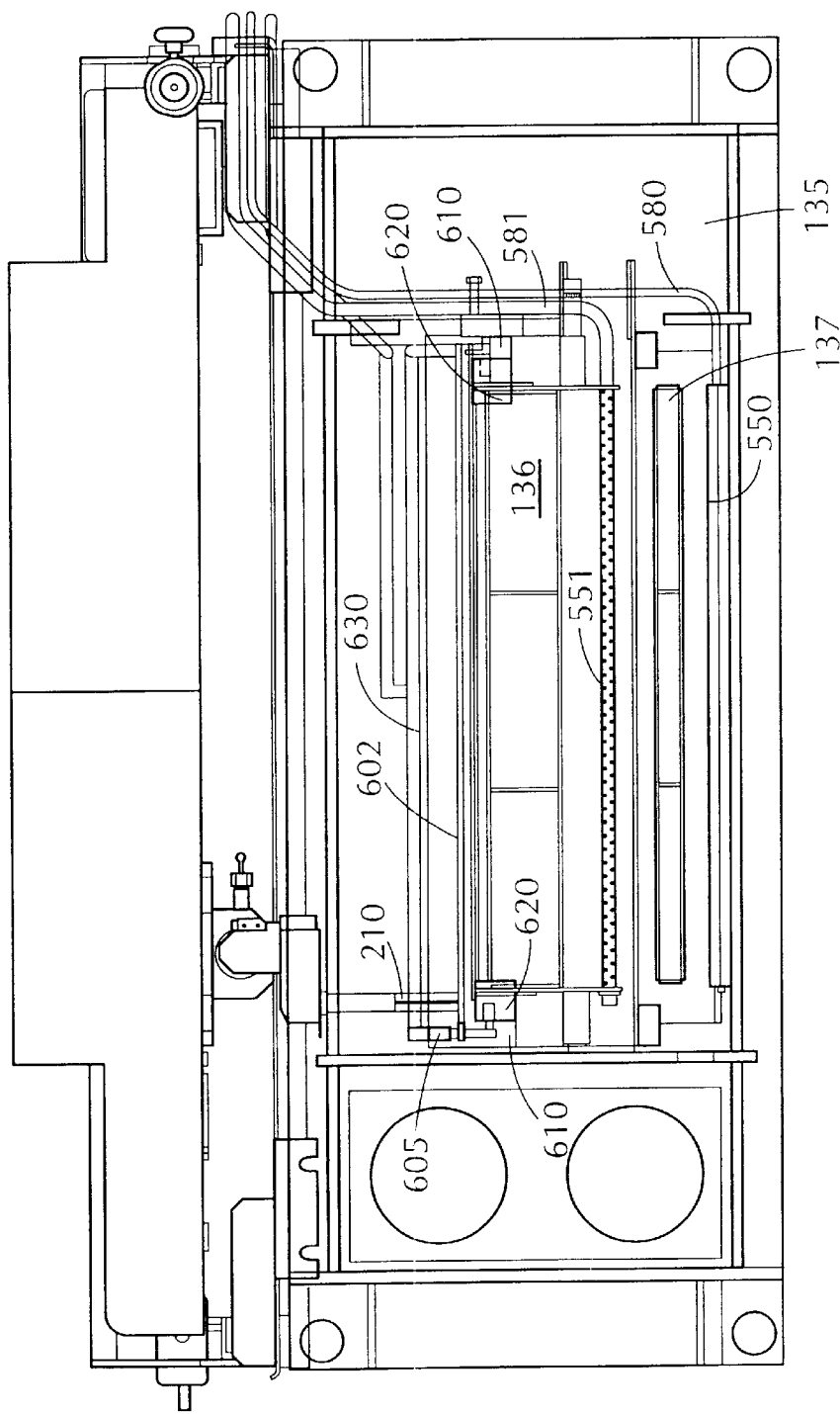
FIG. 25 is a top plan view of the combination of the selective debridging tool and a second embodiment of a modified Nitro Wave™ device.
Figure 26:
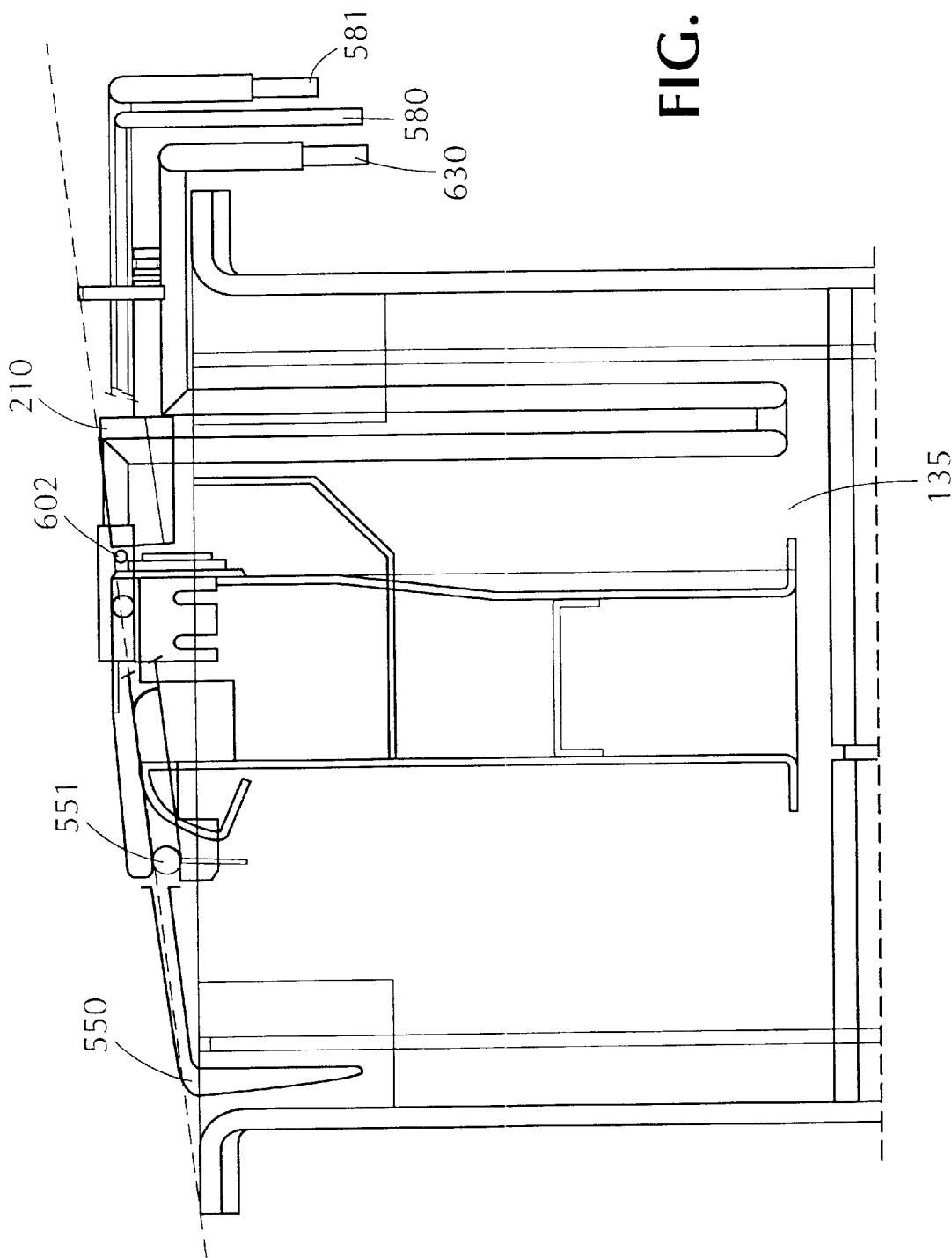
FIG. 26 is a right side view of the combination of FIG. 25.

In a second modified embodiment of the Nitro Wave™, shown in FIGS. 25 and 26, the first and second diffuser pipes are identical to pipes 550, 551 but the third diffuser pipe 602 is mounted between soldering tower 136 and the selective debridging tool 210. Pipe extensions 605 extend perpendicularly from pipe 602 perpendicularly along the sides of the solder pot 135. Third pipe 602 and pipe extensions 605 may be 6 mm in diameter. Pipe 602 has approximately 80–100 holes which are 0.3 mm in diameter and are spaced apart by 7.5 mm. There is no cover above third pipe 602 in this embodiment, but there are side plates 610 above pipe extensions 605. Under each of side plates 610 is a sintered metal diffuser 620. Because of the small diameter of pipe 602 and the holes, a supply manifold 630 parallel to pipe 602 simultaneously supplies nitrogen to both sides of pipe 602. As the board 10 passes over the diffuser pipes, the board 10 serves as a cover to contain the nitrogen in the vicinity of the board during soldering. This embodiment is presently considered superior to the first embodiment because pipe 602 becomes polluted less quickly and because pipe 602 is closer to the line of soldering and better minimizes the oxidation of the solder.

Figure 27:
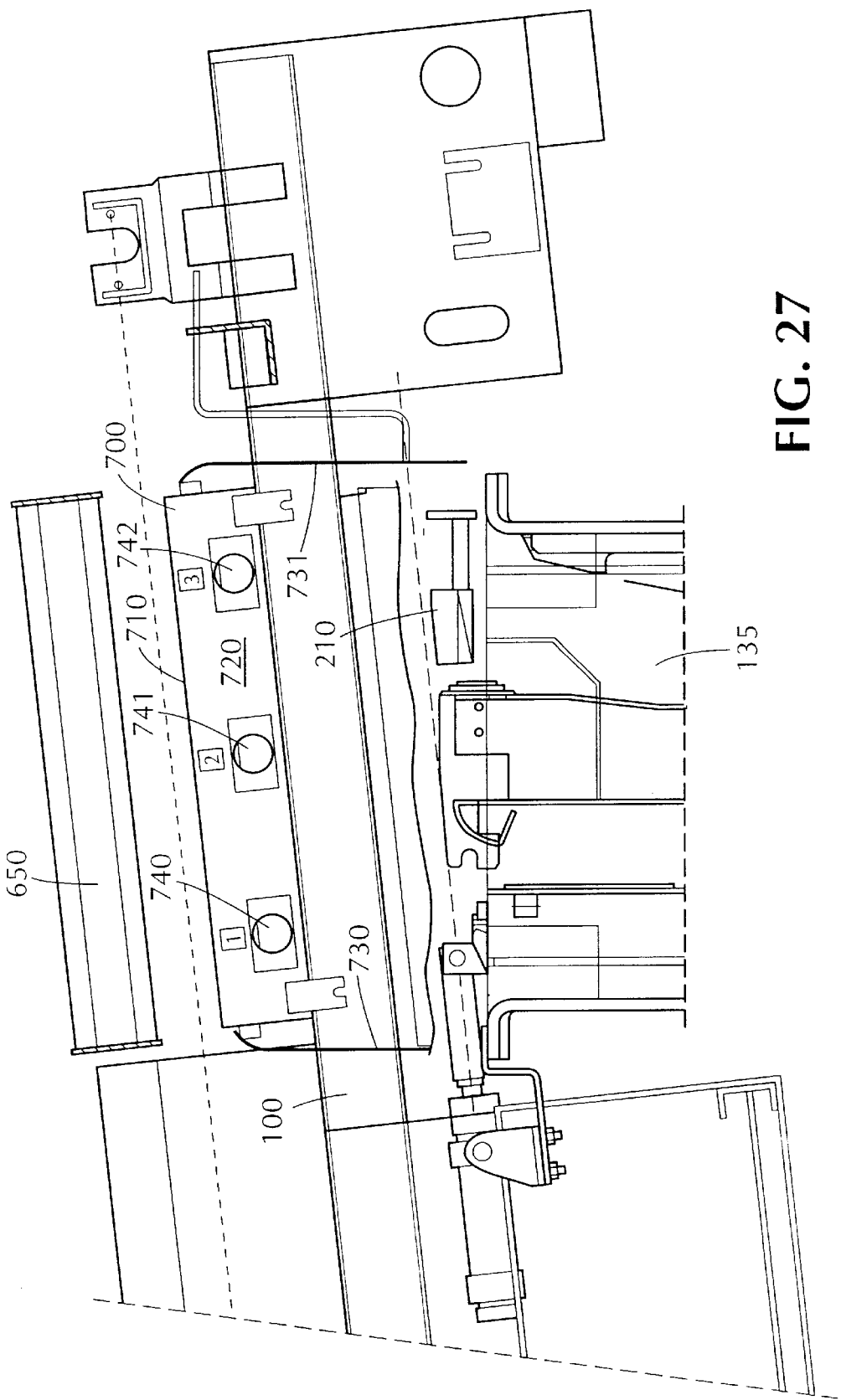
FIG. 27 is a right side view of a modified Nitro Hood™ above the solder waves and selective debridging tool.
Figure 28:
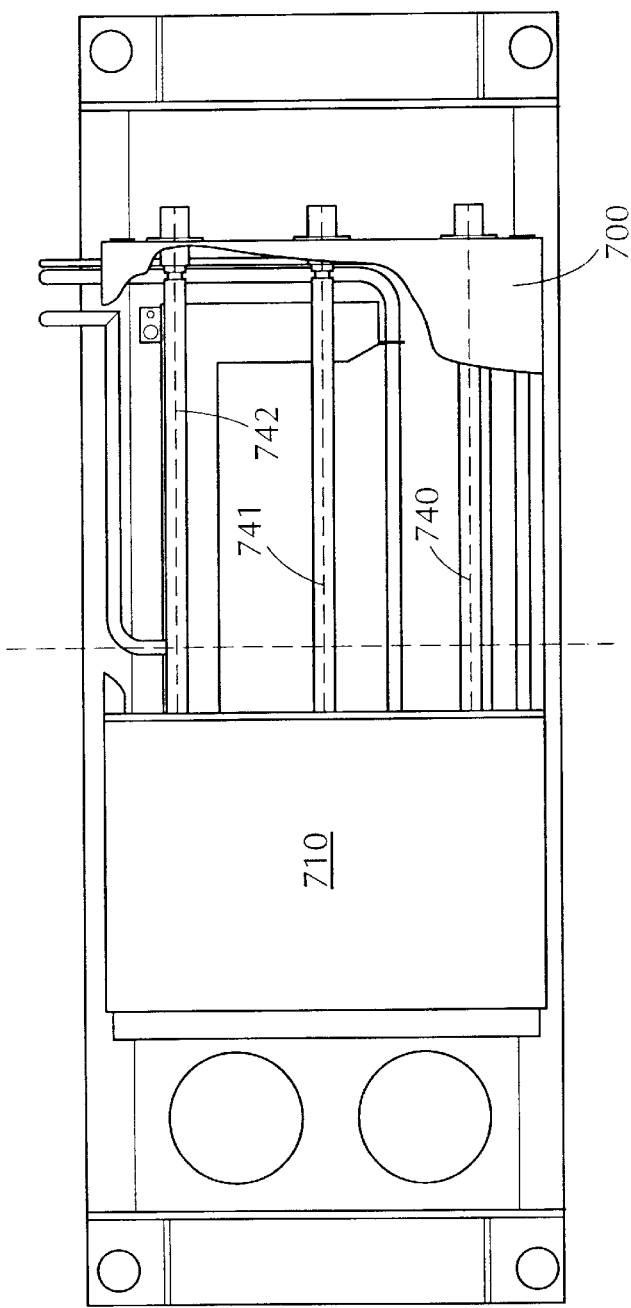
FIG. 28 is a top plan view of the modified Nitro Hood™ shown in FIG. 27.
Figure 29:
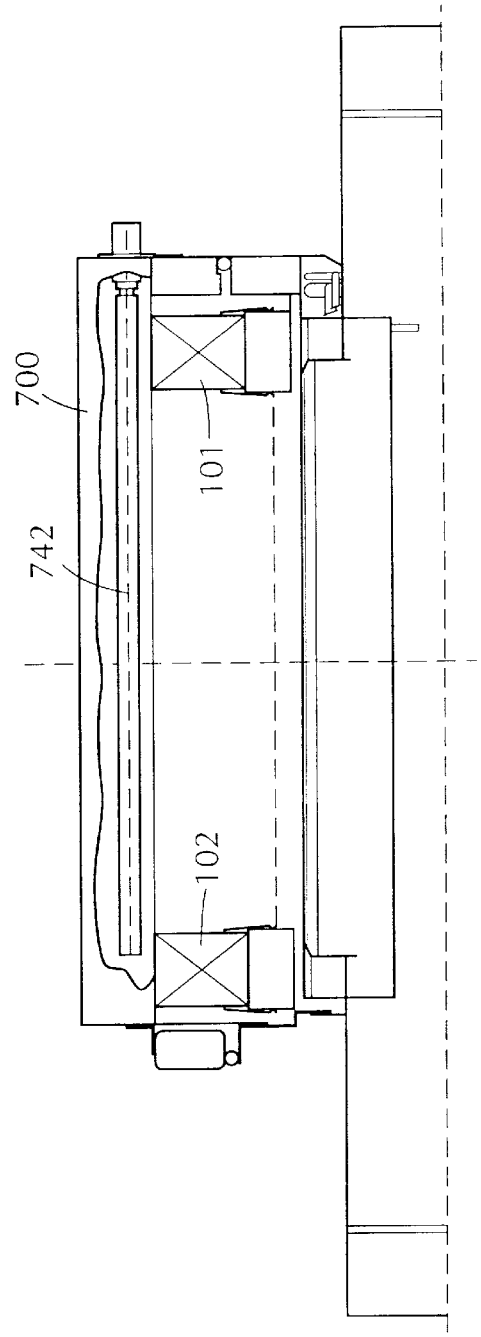
FIG. 29 is a exit side view of the modified Nitro Hood™.
Figure 30:
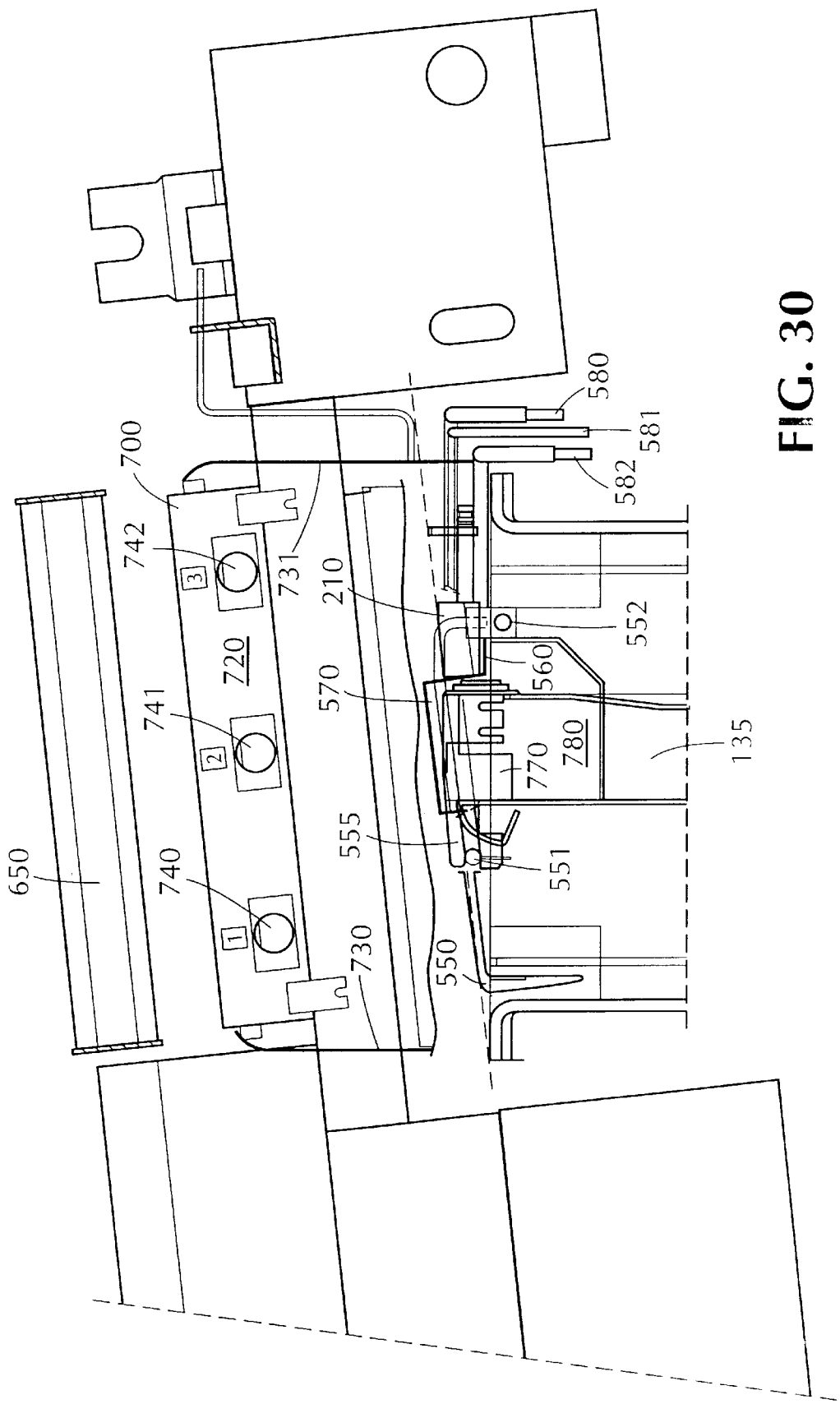
FIG. 30 is a right side view of the combination shown in FIG. 23 together with the modified Nitro Hood™.
Figure 31:
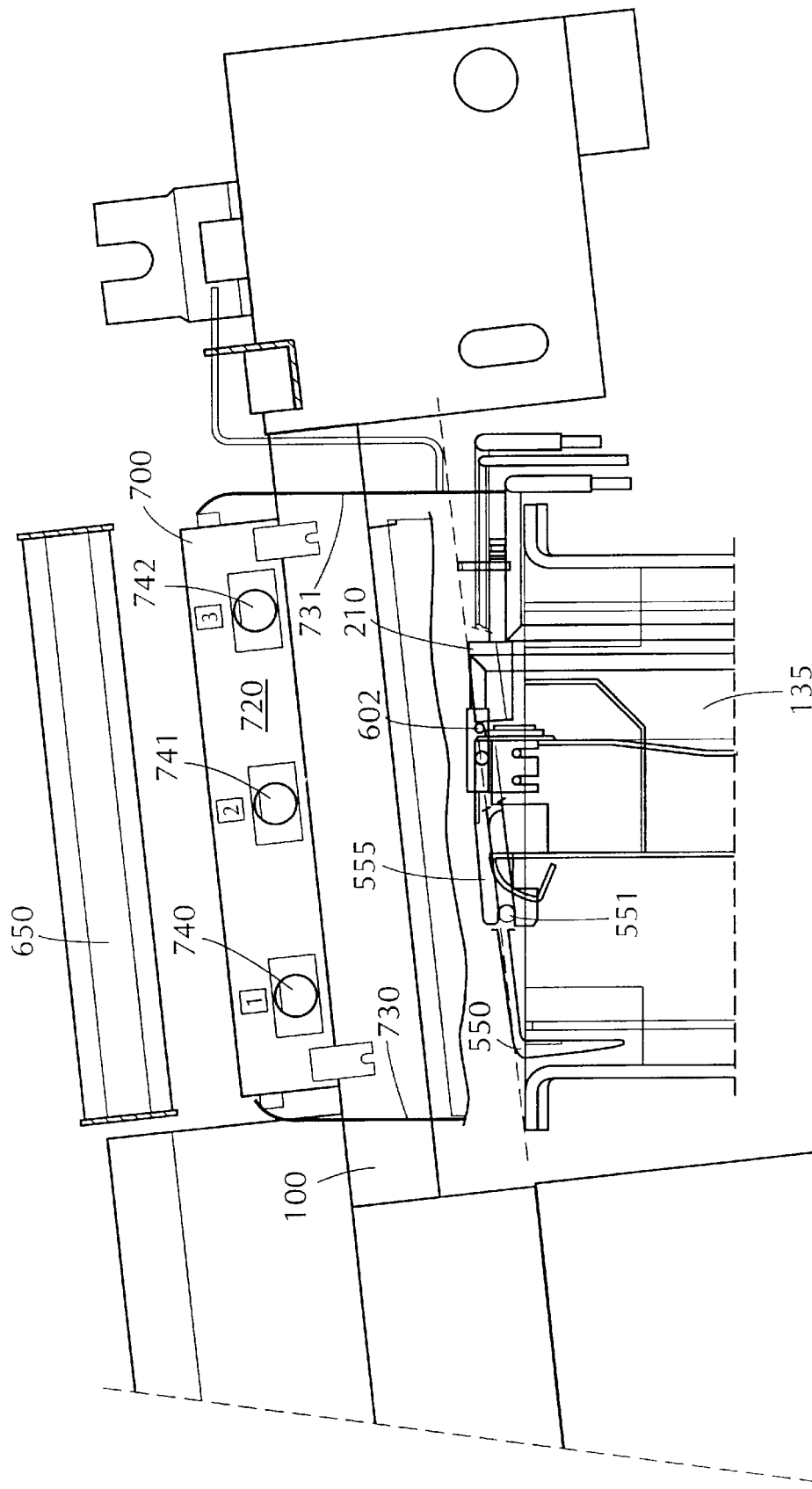
FIG. 31 is a right side view of the combination shown in FIG. 23 together with the modified Nitro Hood™.
Figure 32:
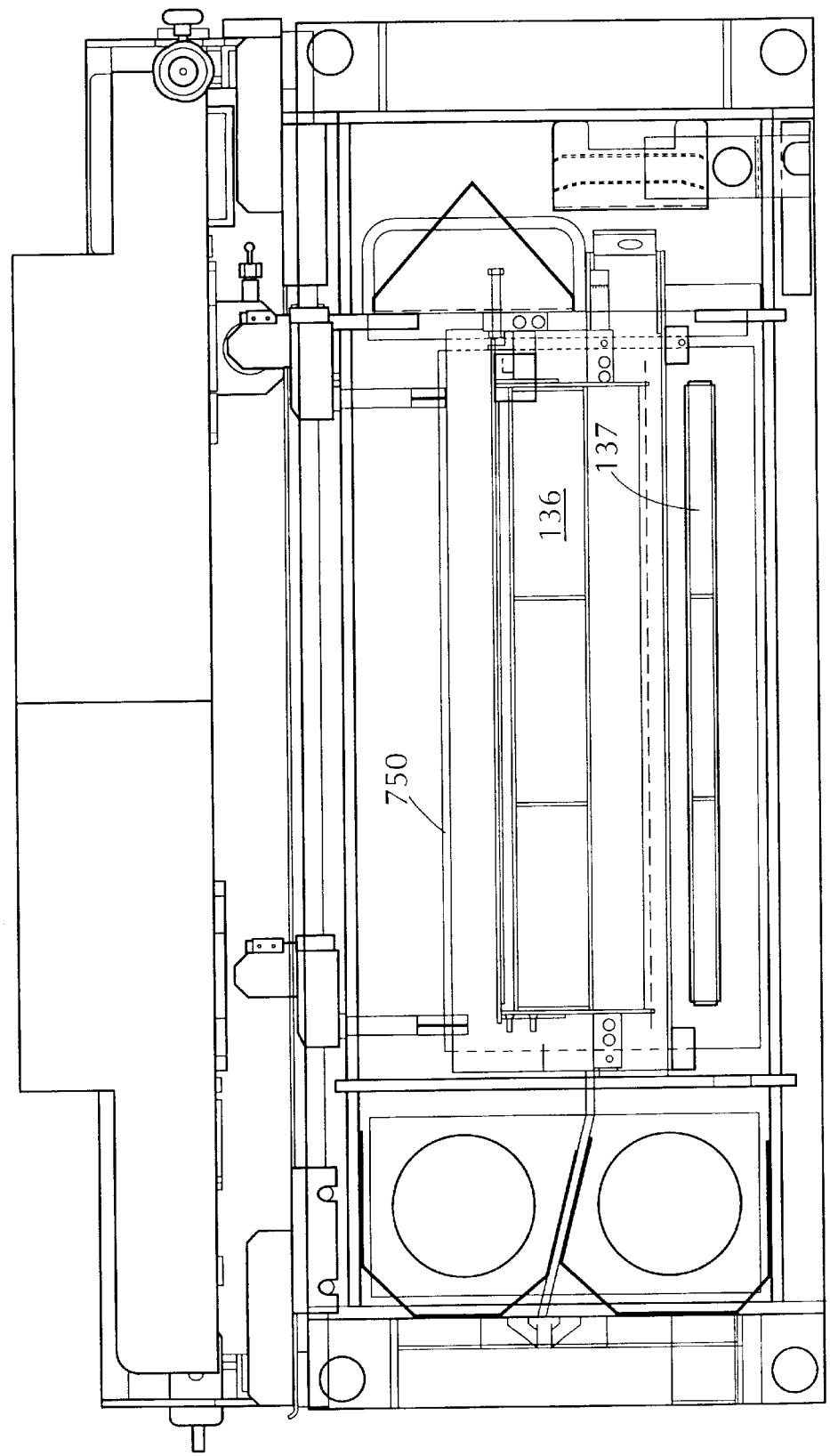
FIG. 32 is a top plan view of the main and chip soldering towers and selective debridging tool illustrating the shortened distance between the back plate of the main soldering tower and the main wave.
Figure 33:
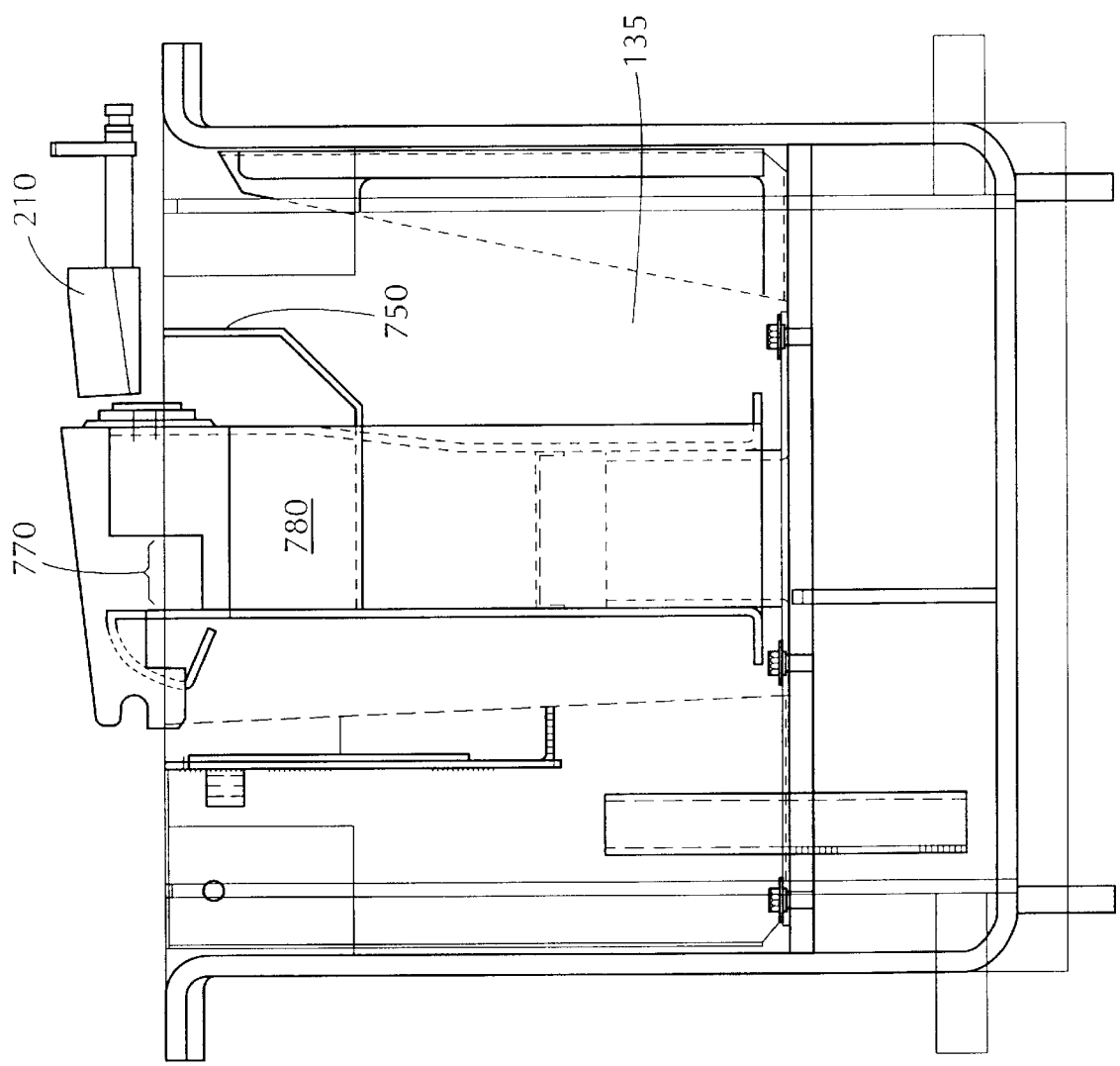
FIG. 33 is a right side view of the main and chip soldering towers and selective debridging tool.

The Nitro Hood™ is another feature that may be added to provide a nitrogen blanket over the wave soldering station 130 and selective debridging tool which minimizes the formation of oxide skins on components and boards as well as the formation of dross. Referring to FIGS. 27–29, the Nitro Hood™ comprises a hood 700 having a top surface 710, side panels 720 that extend downward as closely as possible to the conveyor 100 and curtains 730, 731 at each of the entrance and exit of the hood 700. The curtains 730, 731 have flaps which close off as much as possible the entrance and exit for boards as they move along conveyor 100. In addition, the Nitro Hood™ has three diffusers 740–742 made of sintered metal mounted above the solder wave for diffusing nitrogen or another inert gas even when no boards are being processed. To be used in combination with the selective debridging tool, the Nitro Hood™, as described in U.S. Pat. No. 5,294,036, must only be lengthened to cover both the soldering towers and the selective debridging tool. The modified Nitro Hood™ mounted above the first modified embodiment of the Nitro Wave™ is shown in FIG. 30. The modified Nitro Hood™ mounted above the second modified embodiment of the Nitro Wave™ is shown in FIG. 31. It is preferably mounted to the fixed endless chain conveyor 102 and supported on the back rail support (not shown) of the wave soldering station. Nitrogen is introduced through the diffusers at a rate of 100–2000 cubic feet per hour. By itself, the Nitro Hood™ can reduce the oxygen in the environment surrounding the selective debridging tool and solder pot to 100 ppm or below. Where a hood 700 is used, a stream of nitrogen gas, rather than air, is supplied to the nozzle 210 to supplement the nitrogen environment, and as the nitrogen is emitted from the nozzle, the oxygen level over the solder pot 135 is lowered.

The precise flow of nitrogen to each of the diffuser pipes of Nitro Wave™ and Nitro Hood™ may be measured with separate flow meters (not shown). Since additional oxygen is introduced inside the Nitro Hood™ when boards pass through the curtain flaps 730, 731, an oxygen measurement system may also be included under the Nitro Hood™ to measure how many ppm of oxygen remain under the hood and whether additional nitrogen is required.

A standard main soldering tower 136 for main wave 132 used by Vitronics Soltec has a back plate 750 over which the main wave 132 flows. Back plate 750 is generally 12 cm from the nozzle on the soldering tower 136. When the selective debridging tool is used, it is advantageous to move the back plate approximately 5 cm closer to the nozzle to move the nozzle 210 of the selective debridging tool as close as possible to the wave source. The narrower soldering tower also creates a smaller wave in the direction of travel of the board, the smaller wave reducing the number of bridges that form. The tradeoff for moving the back plate is that the conveyor 100 of the wave soldering system is limited to operating at a substantially 7° angle so as to provide a sufficient amount of surface area of the board to contact the solder wave (whereas placing a back plate 12 cm from the nozzle allows the conveyor 100 to be adjusted between 4–8°).

Figure 34:
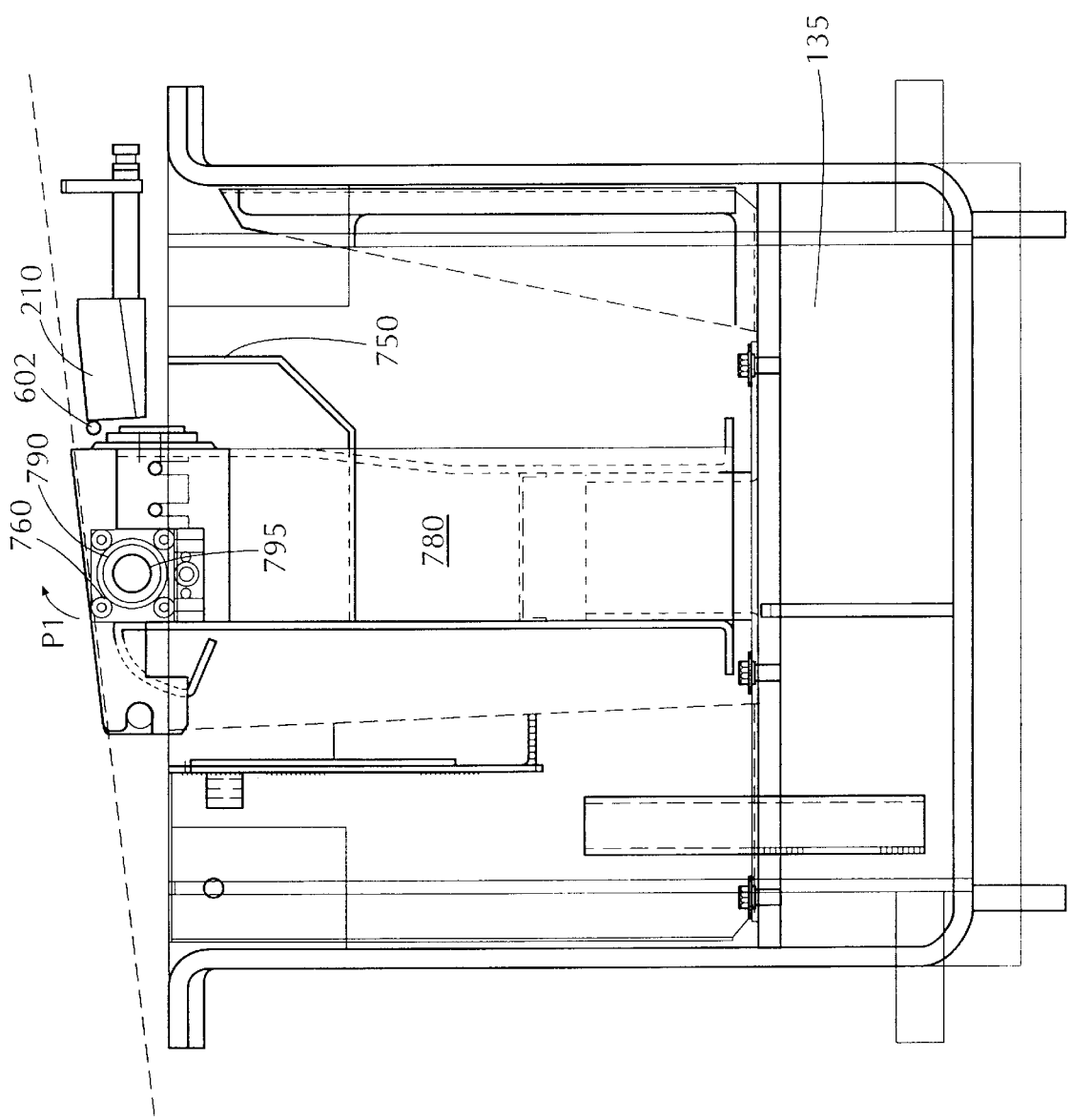
FIG. 34 is a right side view identical to FIG. 33 but with the addition of an insert to generate a Smartwave.

To increase the versatility of the main soldering tower 136, tower 136 may also be provided with a removable insert 760 placed in socket 770. Insert 760 fits within nozzle 780 through which the solder of the main wave 132 flows and has pump means to generate an additional asymmetric wave following the main wave 132 as well as to generate turbulence which increases through hole wetting with the solder when the board is pretreated with a less active, no-clean flux. The pump means may comprise a roller 790 driven by a motor (not shown) in the direction of arrow P1 by driving axle stubs 795. Roller 790 has a non-round shaft, such as a hexagonal shaft, that exerts an upward pressure on the solder wave, thereby generating the turbulence. This feature is marketed commercially by Vitronics Soltec as the optional Smartwave™ feature on its Delta Wave wave soldering systems. It is also described in U.S. Pat. No. 4,848,640 which is incorporated herein by reference. When insert 760 is removed, the soldering tower 136 generates only a normal solder wave. The placement of pipe 602 in the second embodiment of the Nitro Wave™ described above is also shown in FIG. 34.

While the above description describes an air or gas stream being emitted from the nozzle, the invention is not limited thereto. Other appropriate fluids may be used as equivalent substitutes for the air or inert gas in the stream emitted from the nozzle, including gas mixtures and liquids not presently known.

It should be further understood that the present invention is not limited to the described embodiment. For example, additional nozzle assemblies or additional nozzles 400 on a single nozzle assembly (FIG. 17) may be provided in order to reach all of the spots on the board to be selectively debridged quickly enough. Also, as FIG. 17 (a very different alternative embodiment which will not be described in detail) illustrates, the means for transporting the nozzle assembly may be varied to be belt-driven. Another alternative would be to substitute one or more robotic arms as the means of transporting board 10 and/or one or more of the nozzles. In addition, the system can be modified to automatically adjust the parameters described above as being set manually.

One skilled in the art will recognize that other modifications and variations can be made to the above described embodiments, which are presented for purposes of illustration and not of limitation, without departing from the spirit or scope of the invention.

My invention is defined by the following claims:

1. A wave soldering system for soldering electronic components to a printed circuit board comprising
 a tool for removing a bridge of solder from a first surface area of a printed circuit board, said first surface area comprising only a portion of an entire surface area of said printed circuit board, said tool comprising:
  a movable nozzle having an orifice for emitting an air or inert gas stream on said printed circuit board at a temperature that may be varied, and
  means for transporting said nozzle between a park position and said first surface area of said printed circuit board for removing solder from said first surface area; and
 a first thermo measuring device positioned at a selected distance from the orifice above said park position for measuring the temperature of the stream at said park position.

2. The wave soldering system of claim 1 further comprising a transport system for transporting said printed circuit board over said tool at a selected distance from the orifice and said first thermo measuring device is mounted such that it measures the temperature of the stream at the selected distance from the orifice of said nozzle.

3. The wave soldering system of claim 1 further comprising a second thermo measuring device mounted to said tool to measure the temperature of the stream at a point before the stream is emitted from the orifice.

4. A wave soldering system for soldering electronic components to a printed circuit board comprising:
   a conveyor system for transporting said printed circuit board through the wave soldering system,
   a wave soldering station for applying liquid solder to a bottom of said printed circuit board,
   a tool positioned after said wave soldering station for removing a bridge of solder which may form between joints from a first surface area of said printed circuit board, said debridging tool comprising a movable nozzle having an orifice for emitting an inert gas stream on said printed circuit board and means for transporting said nozzle along a path from a park position to said first surface area of said printed circuit board for removing said solder from said first surface area, and
   an atmosphere control means for maintaining an atmosphere with an oxygen content reduced to less then 20% in the vicinity of the tool and the wave soldering station.

5. The wave soldering system of claim 4 wherein said atmosphere control means comprises a nitrogen supply for supplying nitrogen to achieve said oxygen content reduction.

6. The wave soldering system of claim 4 wherein said atmosphere control means comprises a first laterally extending diffuser at least partially located under the path of said debridging tool for diffusing inert gas in the vicinity of the tool and the wave soldering station.

7. The wave soldering system of claim 6 further comprising a second diffuser laterally extending above the wave soldering station.

8. The wave soldering system of claim 6 further comprising an at least partial enclosure above the wave soldering station and a plate between said enclosure and said at least one diffuser to direct said inert gas from the diffuser to under said enclosure.

9. The wave soldering system of claim 8 further comprising a diffuser side plate under said enclosure.

10. The wave soldering system of claim 8 further comprising a hood mounted above said wave soldering station and said tool and having a third diffuser for providing blanketing said wave soldering station and said tool with said inert gas.

11. The wave soldering system of claim 10 wherein said inert gas is nitrogen and said system further comprises a nitrogen supply means to supply nitrogen to said first and third diffusers.

12. The wave soldering system of claim 4 wherein wave soldering station has a soldering tower and said atmosphere control means comprises a first laterally extending diffuser located between the tool and the soldering tower.

13. The wave soldering system of claim 12 further comprising a first diffuser side plate at a first end of said diffuser and a second diffuser side plate at a second end of said diffuser.

14. The wave soldering system of claim 12 further comprising a second laterally extending diffuser.

15. The wave soldering system of claim 12 further comprising a hood mounted above said wave soldering station and said tool and having a third diffuser for blanketing said wave soldering station and said tool with said inert gas.

16. The wave soldering system of claim 15 wherein said inert gas is nitrogen and said system further comprises a nitrogen supply means to supply nitrogen to said first and third diffusers.

17. A wave soldering system for soldering electronic components to a printed circuit board comprising:
   a wave soldering station for applying liquid solder to a bottom of said printed circuit board,
   a tool positioned after said wave soldering station for removing a bridge of solder which may form between joints from a first surface area of said printed circuit board, said debridging tool comprising a movable nozzle having an orifice for emitting a stream of inert gas on said printed circuit board and means for transporting said nozzle from a park position to said first surface area of said printed circuit board for removing said solder from said first surface area, and
   a hood mounted above said wave soldering station and said tool and having at least one diffuser for blanketing said wave soldering station and said tool with said inert gas.

18. A wave soldering system for soldering electronic components to a printed circuit board comprising:
   a soldering tower having a first nozzle for forming a solder wave and a roller driven with a non-round transverse section, wherein said roller is removably insertable within said first nozzle to generate turbulence in said solder wave, and
   a tool for removing a bridge of solder from a first surface area of a printed circuit board, said first surface area comprising only a portion of an entire surface area of said printed circuit board, said tool comprising:
      a second, movable nozzle having an orifice for emitting an air or gas stream on said printed circuit board at a temperature that may be varied, and
      means for transporting said second nozzle between a park position and said first surface area of said printed circuit board for removing solder from said first surface area.

19. The wave soldering system of claim 18 wherein said soldering tower further comprises a back plate over which said solder wave flows, said back plate being no more than 70 mm from said first nozzle.

20. A soldering apparatus, comprising:
   a solder bath;
   a solder tower located in said solder bath, and being arranged to generate a solder flow emerging from the top of said tower;
   transporting means for transporting objects to be soldered above said solder tower, so that those objects are contacted by the solder wave emerging from said solder tower;
   selective debridging means for selectively removing solder bridges present in said soldered objects; and
   a nitrogen supply means for directing a flow of nitrogen towards the separating line of contact between the soldered objects and the solder wave.

21. The soldering apparatus of claim 20 further comprising a path along which said selective debridging means moves and wherein the nitrogen supply means is at least partially located under the path of motion of the selective debridging means.

22. The soldering apparatus of claim 21 wherein the nitrogen supply means also comprises a nozzle located between the path of the selective debridging means and the solder tower.

23. The soldering apparatus of claim 20 wherein the nitrogen supply means also comprises a nozzle located lateral to the solder tower and arranged to direct nitrogen towards a center line of the solder tower.

24. The soldering apparatus of claim 20 further comprising a hood covering both the solder tower and the selective debridging means.

* * * * *